US012677517B2

(12) United States Patent
Park et al.

(10) Patent No.: US 12,677,517 B2
(45) Date of Patent: Jul. 7, 2026

(54) MULTIFOLD MICRO EMITTING DEVICE, DISPLAY APPARATUS HAVING THE SAME, METHOD OF MANUFACTURING THE MULTIFOLD MICRO EMITTING DEVICE, AND METHOD OF MANUFACTURING THE DISPLAY APPARATUS

(71) Applicant: SAMSUNG ELECTRONICS CO., LTD., Suwon-si (KR)

(72) Inventors: Joonyong Park, Suwon-si (KR); Dongkyun Kim, Suwon-si (KR); Dongho Kim, Suwon-si (KR); Kyungwook Hwang, Suwon-si (KR); Junsik Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 411 days.

(21) Appl. No.: 18/220,974

(22) Filed: Jul. 12, 2023

(65) Prior Publication Data

US 2024/0162403 A1     May 16, 2024

(30) Foreign Application Priority Data

Nov. 16, 2022     (KR) ........................ 10-2022-0153997

(51) Int. Cl.
H10H 20/857          (2025.01)
H10H 20/01           (2025.01)
(Continued)

(52) U.S. Cl.
CPC ...... H10H 20/857 (2025.01); H10H 20/8312 (2025.01); H10H 20/8514 (2025.01);
(Continued)

(58) Field of Classification Search
CPC ............. H10H 20/857; H10H 20/8514; H10H 20/8312; H10H 20/0364; H10H 20/0361; H10H 20/032; H01L 25/0753
See application file for complete search history.

(56) References Cited

U.S. PATENT DOCUMENTS 8,082,660 B2     12/2011  Lu et al.
10,418,527 B2    9/2019   Sasaki et al.
(Continued)

FOREIGN PATENT DOCUMENTS

EP     3 690 944 A1      8/2020
KR     10-1997104 B1     7/2019
(Continued)

OTHER PUBLICATIONS

Communication issued on Apr. 3, 2024 by the European Patent Office for European Patent Application No. 23187583.2.

*Primary Examiner* — Mary Ellen Bowman
(74) *Attorney, Agent, or Firm* — Sughrue Mion, PLLC

(57)          ABSTRACT

Provided are a multifold micro emitting device, a display apparatus, a method of manufacturing the multifold micro emitting device, and method of manufacturing the display apparatus. The multifold micro light emitting device includes a plurality of sub light emitting devices, a first electrode configured to apply a voltage to each of the plurality of sub light emitting devices, a second electrode configured to apply a common voltage to the plurality of sub light emitting devices, and a separator configured to separate the plurality of sub light emitting devices from each other, and the plurality of sub light emitting devices are configured as a single chip.

20 Claims, 39 Drawing Sheets

(51) Int. Cl.
    *H10H 20/831*         (2025.01)
    *H10H 20/851*         (2025.01)
    *H10W 90/00*          (2026.01)

(52) U.S. Cl.
    CPC .......... *H10W 90/00* (2026.01); *H10H 20/032*
       (2025.01); *H10H 20/0361* (2025.01); *H10H*
                        *20/0364* (2025.01)

(56)               References Cited

U.S. PATENT DOCUMENTS

| | | | |
|---|---|---|---|
| 10,535,640 | B2 | 1/2020 | Lee et al. |
| 2017/0263178 | A1* | 9/2017 | Bae ........................ H10D 86/60 |
| 2019/0123240 | A1* | 4/2019 | Kang ................... H10H 20/825 |
| 2022/0013400 | A1 | 1/2022 | Hwang et al. |

FOREIGN PATENT DOCUMENTS

| | | |
|---|---|---|
| KR | 10-2019-0112916 A | 10/2019 |
| KR | 10-2019-0135230 A | 12/2019 |
| KR | 10-2020-0014867 A | 2/2020 |
| WO | 2019/170214 A1 | 9/2019 |

\* cited by examiner 623
622
621
615
610

1

MULTIFOLD MICRO EMITTING DEVICE, DISPLAY APPARATUS HAVING THE SAME, METHOD OF MANUFACTURING THE MULTIFOLD MICRO EMITTING DEVICE, AND METHOD OF MANUFACTURING THE DISPLAY APPARATUS

CROSS-REFERENCE TO RELATED APPLICATION

This application is based on and claims priority under 35 U.S.C. § 119 to Korean Patent Application No. 10-2022-0153997, filed on Nov. 16, 2022, in the Korean Intellectual Property Office, the disclosure of which is incorporated by reference herein in its entirety.

BACKGROUND

1. Field

The disclosure relates to a multifold micro emitting device including a plurality of sub light emitting devices configured as a single chip, a display apparatus having the multifold micro emitting device, a method of manufacturing the multifold micro emitting device, and a method of manufacturing the display apparatus.

2. Description of the Related Art

Display apparatuses such as liquid crystal displays (LCDs) and organic light emitting diode (OLED) displays are widely used. Recently, a technology of manufacturing a high-resolution display apparatus using a micro light emitting device has been introduced.

To manufacture a display apparatus using a micro light semiconductor device, many technologies are required, such as a transfer technology of moving a micro-sized light emitting device to a desired display pixel location, a repair process, and a method of implementing a desired color to the micro-sized light emitting device.

SUMMARY

Provided is a multifold micro light emitting device including a plurality of sub light emitting devices configured as a single chip.

Provided is a display apparatus including a multifold micro light emitting device including a plurality of sub light emitting devices configured as a single chip.

Provided is a method of manufacturing a multifold micro light emitting device including a plurality of sub light emitting devices configured as a single chip.

Provided is a method of manufacturing a display apparatus including a multifold micro light emitting device including a plurality of sub light emitting devices configured as a single chip.

Additional aspects will be set forth in part in the description which follows and, in part, will be apparent from the description, or may be learned by practice of the presented embodiments of the disclosure.

According to an aspect of the disclosure, there is provided a micro light emitting device including: a plurality of sub light emitting devices comprising a first type semiconductor layer, an active layer provided on the first type semiconductor layer, and a second type semiconductor layer provided on the active layer, the active layer configured to emit light; a plurality of first electrodes, each configured to apply a voltage to the first type semiconductor layer or the second type semiconductor layer of one of the plurality of sub light emitting devices; a second electrode configured to apply a common voltage to the first type semiconductor layer or the second type semiconductor layer of each of the plurality of sub light emitting devices; and a separator configured to separate the plurality of sub light emitting devices from each other, wherein the plurality of sub light emitting devices are configured as a single chip.

The separator may be configured to electrically and optically separate the plurality of sub light emitting devices.

The separator may include an insulator having a light absorption or reflection characteristic.

The separator may be provided to separate the second electrode into a plurality parts.

The separator may include a cross-shaped barrier rib structure.

According to another aspect of the disclosure, there is provided a display apparatus including: a driving substrate comprising a driving circuit; and a micro light emitting device bonded to the driving substrate, wherein the micro light emitting device includes: a plurality of sub light emitting devices comprising a first type semiconductor layer, an active layer provided on the first type semiconductor layer, and a second type semiconductor layer provided on the active layer, the active layer configured to emit light; a plurality of first electrodes, each configured to apply a voltage to the first type semiconductor layer or the second type semiconductor layer of one of the plurality of sub light emitting devices; a second electrode configured to apply a common voltage to the first type semiconductor layer or the second type semiconductor layer of each of the plurality of sub light emitting devices; and a separator configured to separate the plurality of sub light emitting devices from each other, wherein the plurality of sub light emitting devices are configured as a single chip.

The display apparatus may include a color conversion layer provided on an upper portion of each of the plurality of sub light emitting devices.

The display apparatus may include a plurality of pixels, each of the plurality of pixels comprises a blue sub pixel configured to display blue color, a green sub pixel configured to display green color, and a red sub pixel configured to display red color, wherein each of the plurality of sub light emitting devices is configured to emit blue light, a green color conversion layer is provided on an upper portion of a sub light emitting device in the green sub pixel, and a red color conversion layer is provided on an upper portion of a sub light emitting device in the red sub pixel.

According to another aspect of the disclosure, there is provided a method of manufacturing a micro light emitting device, the method including depositing a first type semiconductor layer, an active layer, and a second type semiconductor layer on a substrate; forming an isolation pattern, a first electrode pattern, and a separator pattern by etching the second type semiconductor layer and the active layer; providing an insulating layer on the second type semiconductor layer, the isolation pattern, the first electrode pattern, and the separator pattern; forming an isolator by etching the insulating layer in a first region corresponding to the isolation pattern and a first type semiconductor layer; separating the plurality of sub light emitting devices from each other by etching the insulating layer in a second region corresponding to the separator pattern and the first type semiconductor layer and forming a separator in the second region; forming a second electrode pattern by etching the insulating layer on an upper portion of the second type semiconductor layer with respect to an upper portion of the separator; forming a first electrode on the first electrode pattern and forming a second electrode on the second electrode pattern; and separating the micro light emitting device comprising the plurality of sub light emitting devices into chip units through the isolator by removing the substrate.

According to another aspect of the disclosure, there is provided a method of manufacturing a display apparatus, the method including: forming a micro light emitting device including a plurality of sub light emitting devices having a first type semiconductor layer, an active layer provided on the first type semiconductor layer, and a second type semiconductor layer provided on the active layer, a plurality of first electrodes, each configured to apply a voltage to the first type semiconductor layer or the second type semiconductor layer of one of the plurality of sub light emitting devices; a second electrode configured to apply a common voltage to the first type semiconductor layer or the second type semiconductor layer of each of the plurality of sub light emitting devices, and a separator configured to separate the plurality of sub light emitting devices from each other, wherein the plurality of sub light emitting devices are configured as a single chip; transferring the micro light emitting device onto a driving substrate comprising a driving circuit using one of wet transfer, dry transfer, or pick-and-place transfer; and forming a color conversion layer on an upper portion of the micro light emitting device.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
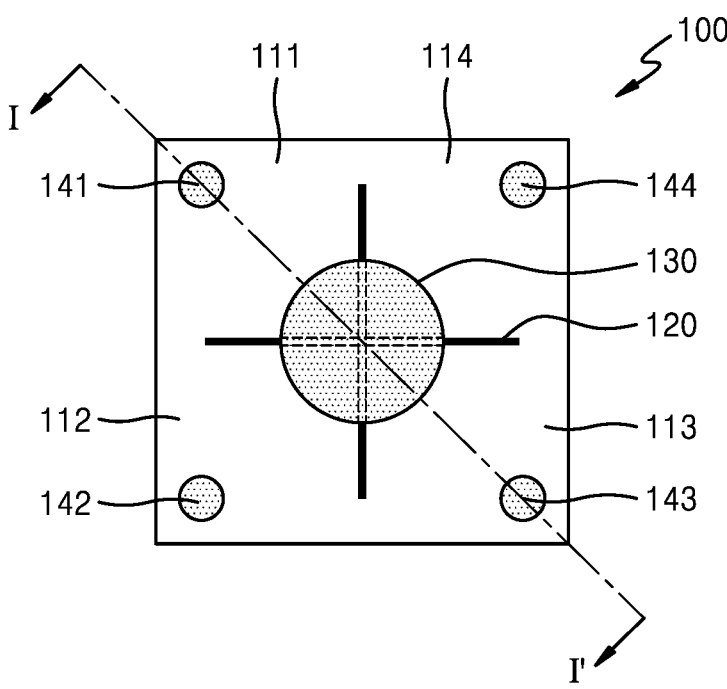
FIG. 1 schematically illustrates a plan view of a multifold micro light emitting device according to an example embodiment.

Reference will now be made in detail to embodiments, examples of which are illustrated in the accompanying drawings, wherein like reference numerals refer to like devices throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of devices, modify the entire list of devices and do not modify the individual devices of the list. As used herein, an expression "at least one of" preceding a list of elements modifies the entire list of the elements and does not modify the individual elements of the list. For example, an expression, "at least one of a, b, and c" should be understood as including only a, only b, only c, both a and b, both a and c, both b and c, or all of a, b, and c.

Hereinafter, a multifold micro emitting device, a display apparatus having the multifold micro emitting device, a manufacturing method of the multifold micro emitting device, and a manufacturing method of the display apparatus according to various embodiments will be described with reference to the attached drawings. Like reference numerals denote like elements throughout, and in the drawings, sizes of elements may be exaggerated for clarity and convenience of explanation. It will be understood that although the terms "first," "second," etc. may be used herein to describe various elements, these elements should not be limited by these terms. These terms are only used to distinguish one element from another.

The singular forms "a," "an," and "the" are intended to include the plural forms as well, unless the context clearly indicates otherwise. When a portion "includes" an element, another element may be further included, rather than excluding the existence of the other element, unless otherwise described. Sizes or thicknesses of elements may be exaggerated for clarity of explanation. It will also be understood that when a material layer is referred to as being "on" another layer or a substrate, the material layer may be directly on the other layer or the substrate, or intervening layers may also be present therebetween. A material of each layer in the following embodiments is an example, and thus other materials may be used.

Also, in the specification, the term " . . . units" or " . . . modules" mean units or modules that process at least one function or operation, and may be implemented by hardware, software, or a combination of hardware and software.

The particular implementations shown and described herein are illustrative examples and are not intended to otherwise limit the scope of the disclosure in any way For the sake of brevity, conventional electronics, control systems, software, and other functional aspects of the systems may not be described in detail. Also, lines or members connecting elements illustrated in the drawings are merely illustrative of functional connections and/or physical or circuit connections. In an actual device, the connections between components may be represented by various functional connections, physical connections, or circuit connections that are replaceable or added.

The use of the terms "a" and "an," and "the" and similar referents in the context of describing the disclosure is to be construed to cover both the singular and the plural.

The operations of all methods described herein may be performed in any suitable order unless otherwise indicated herein or otherwise clearly contradicted by context. The use of any and all examples, or exemplary language (e.g., "such as") provided herein, is intended merely to better illuminate the disclosure and does not pose a limitation on the scope of the disclosure unless otherwise claimed.

Figure 2:
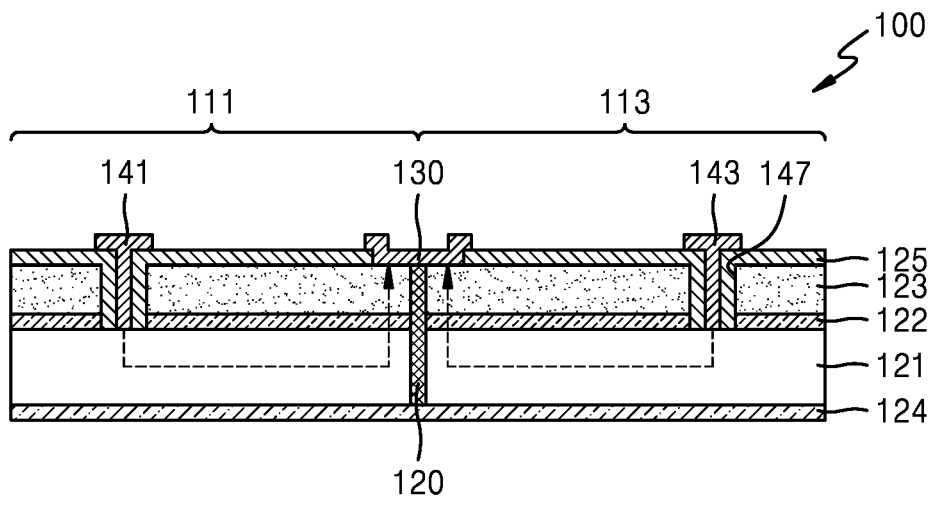
FIG. 2 is an example of a cross-sectional view taken along line I-I' of FIG. 1.

FIG. 1 schematically illustrates a plan view of a multifold micro light emitting device according to an example embodiment. FIG. 2 is a cross-sectional view taken along line I-I' of FIG. 1.

A multifold micro light emitting device 100 includes a plurality of sub light emitting devices 111, 112, 113, and 114, a second electrode 130 applying a common voltage to the plurality of sub light emitting devices 111, 112, 113, and 114, a plurality of first electrodes 141, 142, 143, and 144 respectively applying voltages to the plurality of sub light emitting devices 111, 112, 113, and 114, and a separator 120 configured to separate the plurality of sub light emitting devices 111, 112, 113, and 114 from each other. The plurality of sub light emitting devices 111, 112, 113, and 114 may include, for example, a first sub light emitting device 111, a second sub light emitting device 112, a third sub light emitting device 113, and a fourth sub light emitting devices 114. According to an example embodiment illustrated in FIG. 1, the four sub light emitting devices may constitute one pixel of a display apparatus. However, the disclosure is not limited thereto, and as such, a pixel configuration may be different from the illustrated in FIG. 1. For example, the number of sub light emitting devices constituting one pixel may be less than or greater than four. A pixel may represent a minimum unit, which displays color in a display apparatus, and may include a plurality of sub pixels. A plurality of sub light emitting devices may respectively correspond to the plurality of sub pixels.

According to an example embodiment, the separator 120 may be configured to electrically separate the plurality of sub light emitting devices 111, 112, 113, and 114. According to an example embodiment, the separator 120 may be configured to optically separate the plurality of sub light emitting devices 111, 112, 113, and 114. According to an example embodiment, the separator 120 may be configured to electrically and optically separate the plurality of sub light emitting devices 111, 112, 113, and 114. The separator 120 may include an insulator having a light absorption or reflection characteristic. For example, the separator 120 may include a black matrix photoresist, oxide, or a distributed Bragg reflective layer. The oxide may include titanium oxide, silicon oxide, or aluminum oxide. The titanium oxide may include, for example, $TiO_2$, the silicon oxide may include $SiO_2$, and the aluminum oxide may include $Al_2O_3$.

The separator 120 may include a barrier rib structure for separating the plurality of sub light emitting devices 111, 112, 113, and 114. According to an example embodiment, the separator 120 may have a cross-shaped barrier rib structure as shown in FIG. 1 and separate the multifold micro light emitting device 100 into the first sub light emitting device 111, the second sub light emitting device 112, the third sub light emitting device 113, and the fourth sub light emitting device 114. However, the disclosure is not limited the structure illustrated in FIG. 1, and as such, the separator 120 may have various types of structures. For example, the separator 120 may have a barrier structure different from the cross-shaped barrier rib structure. The separator 120 may be spaced apart from an outer boundary of the multifold micro light emitting device 100. That is, the separator 120 may not reach the outer boundary of the multifold micro light emitting device 100 but may be separated from the outer boundary by a certain distance. This may reduce the weakening of bonding force between the plurality of sub light emitting devices 111, 112, 113, and 114 by the separator 120. The separator 120 may include, for example, oxide.

Each of the plurality of sub light emitting devices 111, 112, 113, and 114 may include a first type semiconductor layer 121, an active layer 122 provided on the first type semiconductor layer 121, and a second type semiconductor layer 123 provided on the active layer 122. Here, the active layer 122 may emit light.

The first type semiconductor layer 121 may include an n-type semiconductor. The first type semiconductor layer 121 may include an III-V group n-type semiconductor, for example, n-GaN. The type 1 semiconductor layer 121 may have a single layer or multilayer structure.

The active layer 122 may be provided on an upper surface of the first type semiconductor layer 121. According to an example embodiment, the active layer 122 may be provided directly on the upper surface of the first type semiconductor layer 121. The active layer 122 may combine electrons and holes to generate light. The active layer 122 may have a multi-quantum well (MQW) or single-quantum well (SQW) structure. The active layer 122 may include an III-V group semiconductor, for example, GaN.

The second type semiconductor layer 123 may be provided on an upper surface of the active layer 122. According to an example embodiment, The second type semiconductor layer 123 may be provided directly on the upper surface of the active layer 122. The second type semiconductor layer 123 may include, for example, a p-type semiconductor. The second type semiconductor layer 123 may include an III-V group p-type semiconductor, for example, p-GaN. The type 2 semiconductor layer 123 may have a single layer or multilayer structure. Alternatively, when the first type semiconductor layer 121 includes a p-type semiconductor, the second type semiconductor layer 123 may include an n-type semiconductor.

The second electrode 130 may be provided in common contact with the plurality of sub light emitting devices 111, 112, 113, and 114. That is, the second electrode 130 may be positioned over a partial area of each of the plurality of sub light emitting devices 111, 112, 113, and 114. The second electrode 130 may operate as a common electrode. For example, the separator 120 may be provided to separate the second electrode 130 into four parts. The plurality of first electrodes 141, 142, 143, and 144 may be independently provided in the plurality of sub light emitting devices 111, 112, 113, and 114, respectively. The plurality of first electrodes 141, 142, 143, and 144 may operate as pixel electrodes. Each of the plurality of first electrodes 141, 142, 143, and 144 may be connected to the corresponding first type semiconductor layer 121, and the second electrode 130 may be connected to the second type semiconductor layer 123 of each of the plurality of sub light emitting devices 111, 112, 113, and 114. The multifold micro light emitting device 100 may have a horizontal electrode structure in which the second electrode 130 and the plurality of first electrodes 141, 142, 143, and 144 are provided on the same plane.

According to an example embodiment, the second electrode 130 may be provided in the central region of the plurality of sub light emitting devices 111, 112, 113, and 114, and the plurality of first electrodes 141, 142, 143, and 144 may be respectively provided close to the outer boundaries of the plurality of sub light emitting devices 111, 112, 113, and 114 so that the distance between the second electrode 130 and each of the plurality of first electrodes 141, 142, 143, and 144 may satisfy a criterion. For example, the distance between the second electrode 130 and each of the plurality of first electrodes 141, 142, 143, and 144 may be secured as large as possible so than an electrical connection of the second electrode 130 and each of the plurality of first electrodes 141, 142, 143, and 144 with a thin film transistor (TFT) can be easily performed.

According to an example embodiment, a buffer layer 124 may be provided on a side of the first type semiconductor layer 121 opposite to a side on which the active layer 122 is provided. For example the buffer layer 124 may be provided below the first type semiconductor layer 121. According to an example embodiment, the buffer layer 124 may be used to assist the growth of the first type semiconductor layer 121, the active layer 122, and the second type semiconductor layer 123, and may include AlN. According to an example embodiment, a via 147 may be provided corresponding to the plurality of first electrodes 141, 142, 143, and 144. For example, each of the plurality of first electrodes 141, 142, 143, and 144 may include a portion provided in a via 147, which penetrates through the second semiconductor type layer 123 and the active layer 122 to reach the first type semiconductor layer 121. According to an example embodiment, an insulating layer 125 may be provided on the second type semiconductor layer 123. The insulating layer 125 may also be provided in the via 147 penetrating the second type semiconductor layer 123 and the active layer 122 so that the plurality of first electrodes 141, 142, 143, and 144 are insulated from the second type semiconductor layer 123 and the active layer 122. The separator 120 may have a barrier rib structure extending from the second type semiconductor layer 123 to the first type semiconductor layer 121. The separator 120 may be provided through the second type semiconductor layer 123, the active layer 122, and the first type semiconductor layer 121. The separator 120 may block or minimize an electrical flow between the plurality of sub light emitting devices 111, 112, 113, and 114 so that each of the plurality of sub light emitting devices 111, 112, 113, and 114 performs an independent light emitting operation.

As described above, in the multifold micro light emitting device 100 according to an example embodiment, the plurality of sub light emitting devices 111, 112, 113, and 114 may be configured in a single chip structure. Therefore, the size of a sub light emitting device may be reduced, and even if the size is reduced, a required distance between the second electrode 130 and each of the plurality of first electrodes 141, 142, 143, and 144 may be secured. In addition, when a display apparatus is manufactured using the multifold micro light emitting device 100, a multifold micro light emitting device may be transferred in chip units, thereby transferring a plurality of sub light emitting devices at once.

Figure 3:
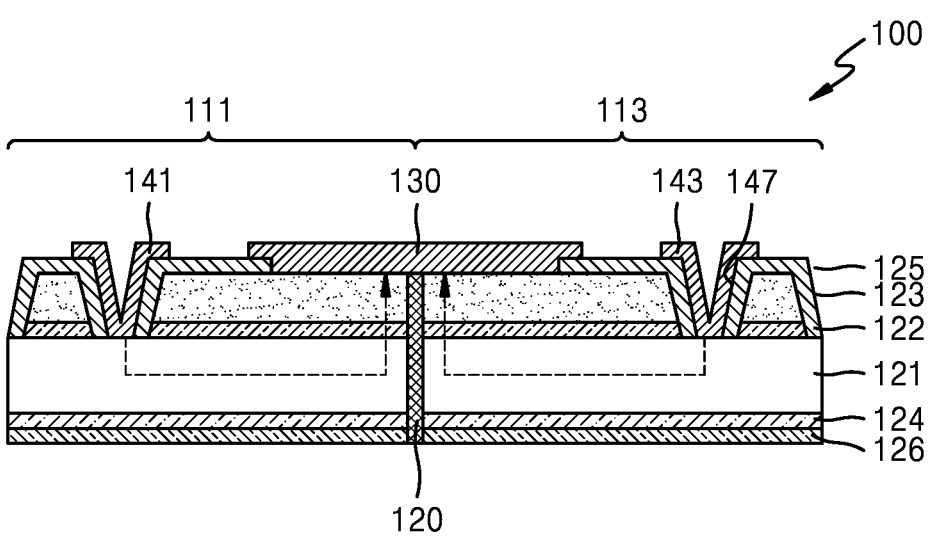
FIG. 3 is another example of a cross-sectional view taken along line I-I' of FIG. 1.

FIG. 3 shows an example in which an oxide layer is further provided in the multifold light emitting device of FIG. 2. Compared with FIG. 2, although shapes of a first electrode and a second electrode are slightly different in FIG. 3, the same member numbers are used for description. For example, the plurality of first electrodes and the insulating layer 125 may be provided in an opening in the second semiconductor type layer 123 and the active layer 122. The opening may be a V-shaped opening. Components using the same reference numerals as those in FIG. 2 have substantially the same functions and actions, and thus, detailed descriptions thereof are omitted and only differences will be described here. According to an example embodiment, an oxide layer 126 may be provided on a side of the buffer layer 124 different from a side on which the first type semiconductor layer 121 is provided. For example, further provided below the buffer layer 124. The oxide layer 126 may be formed by backside deposition. Also, the separator 120 may be provided from the second type semiconductor layer 123 to the oxide layer 126. That is, the separator 120 may be provided below the second electrode 130, and may penetrate the second type semiconductor layer 123, the active layer 122, the first type semiconductor layer 121, the buffer layer 124, and the oxide layer 126.

Figure 4:
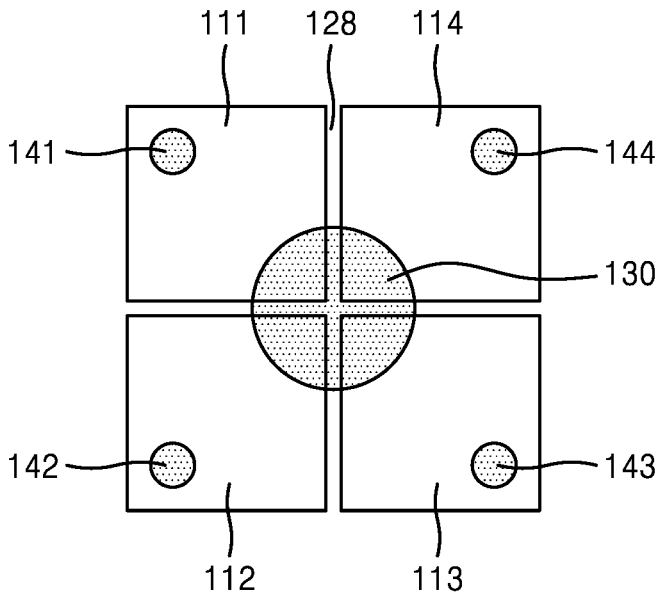
FIG. 4 illustrates an example in which a multifold micro light emitting device according to an example embodiment includes a separator having a separation hole structure.

FIG. 4 shows an example in which a separator 128 has a separation hole structure according to an example embodiment. For example, the separator 128 may be configured as a separation space between the plurality of sub light emitting devices 111, 112, 113, and 114. The separator 128 having the separation hole structure may be provided between the plurality of sub light emitting devices 111, 112, 113, and 114, and each of the plurality of sub light emitting devices 111, 112, 113, and 114 may be combined with each other by the second electrode 130.

Figure 5:
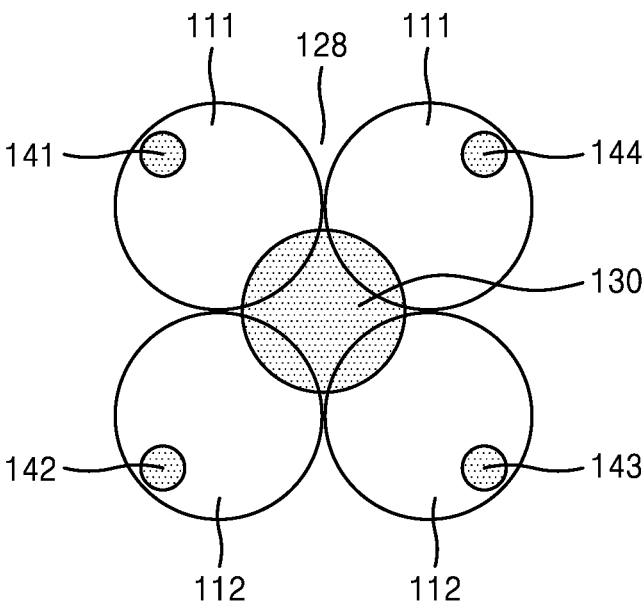
FIG. 5 illustrates an example in which each of a plurality of sub light emitting devices of a multifold micro light emitting device according to an example embodiment has a circular structure.

FIG. 5 illustrates an example in which the shapes of each of a plurality of sub light emitting devices is modified in the multifold micro light emitting device of FIG. 4. In FIG. 4, each of the plurality of sub light emitting devices 111, 112, 113, and 114 may have a rectangular cross-sectional shape, and in FIG. 5, each of the plurality of sub light emitting devices 111, 112, 113, and 114 may have a circular cross-sectional shape. However, the disclosure is not limited to the rectangular cross-sectional shape or the circular cross-sectional shape, and as such, according to another example embodiment, the shape of each of the plurality of sub light emitting devices 111, 112, 113, and 114 may be modified in various ways.

Figure 6:
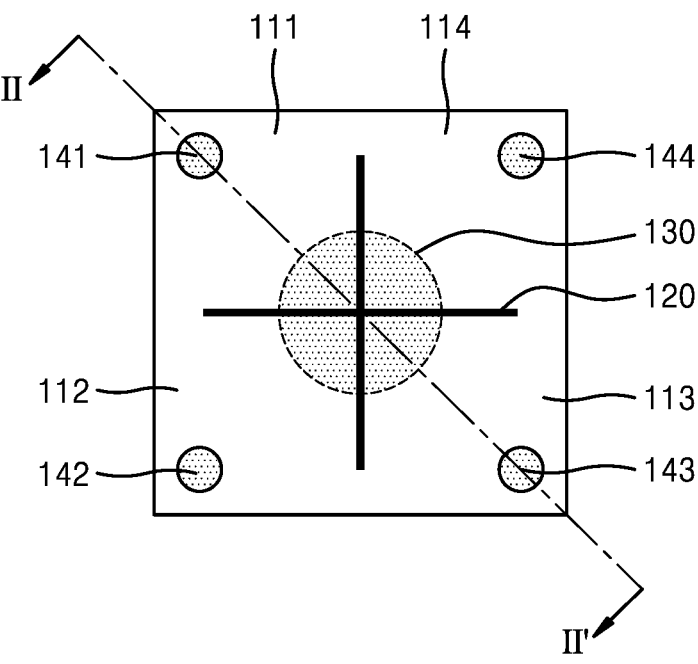
FIG. 6 illustrates an example in which a multifold micro light emitting device according to an example embodiment has a vertical electrode structure.
Figure 7:
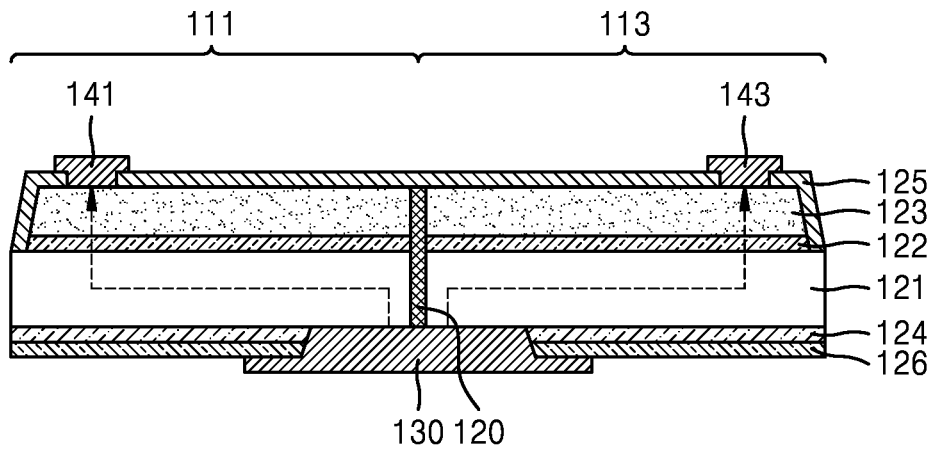
FIG. 7 is a cross-sectional view taken along line II-II' of FIG. 6.

FIG. 6 illustrates an example in which a multifold micro light emitting device has a vertical electrode structure according to an example embodiment. FIG. 7 is a cross-sectional view taken along line II-II' of FIG. 6. Only differences between FIGS. 1 and 2 and FIGS. 6 and 7 are described.

The plurality of first electrodes 141, 142, 143, and 144 may be provided on the second type semiconductor layer 123 and electrically connected to the second type semiconductor layer 123, and the second electrode 130 may be provided below the first type semiconductor layer 121 and electrically connected to the first type semiconductor layer 121. Here, the multifold micro light emitting device may be separated into the plurality of sub light emitting devices 111, 112, 113, and 114 by the separator 120.

Figure 8:
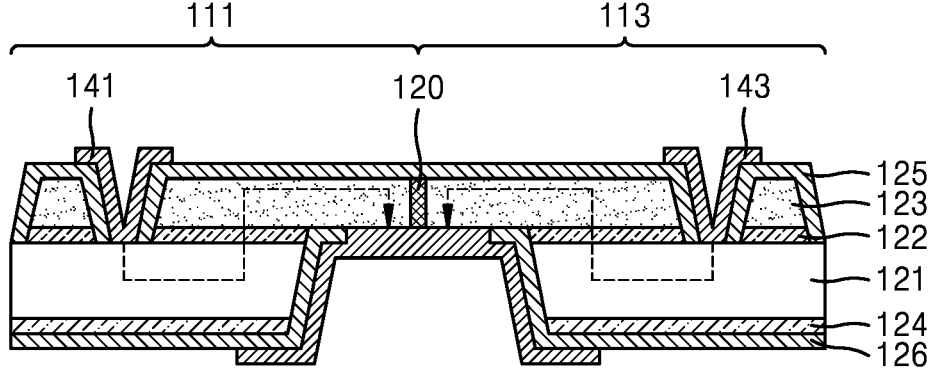
FIG. 8 illustrates an example in which a multifold micro light emitting device according to an example embodiment has another vertical electrode structure.

FIG. 8 illustrates a multifold micro light emitting device has a vertical electrode structure according to another example embodiment. The plurality of first electrodes 141, 142, 143, and 144 may be provided on the second type semiconductor layer 123 and electrically connected to the first type semiconductor layer 121, and the second electrode 130 may be provided below the first type semiconductor layer 121 and connected to the second type semiconductor layer 123. In this case, the second electrode 130 may be insulated from the first type semiconductor layer 121 by the oxide layer 126. The separator 120 in the central portion of the multifold micro light emitting device may be provided between the insulating layer 125 and the second electrode 130.

Figure 9:
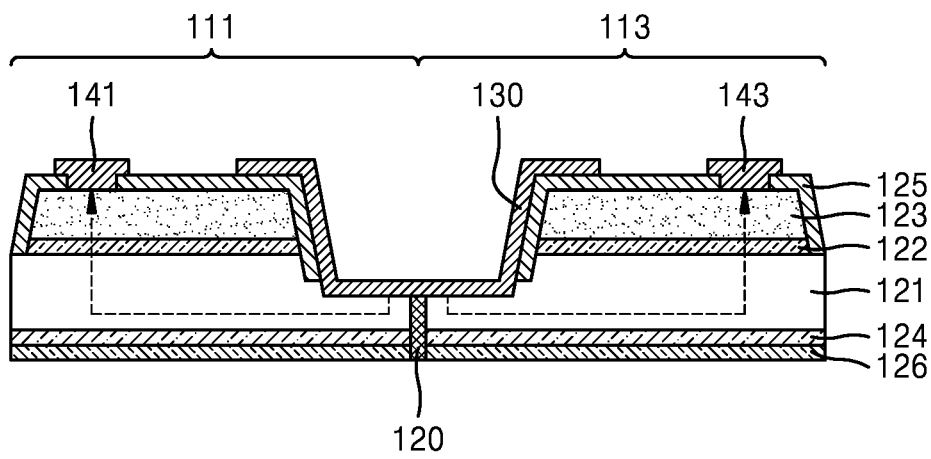
FIG. 9 illustrates an example in which a multifold micro light emitting device according to an example embodiment has another horizontal electrode structure.

FIG. 9 illustrates a multifold micro light emitting device has a horizontal electrode structure according to another example embodiment. The plurality of first electrodes 141, 142, 143, and 144 may be provided on the second type semiconductor layer 123 and electrically connected to the second type semiconductor layer 123, and the second electrode 130 may be provided on the second type semiconductor layer 123 and electrically connected to the first type semiconductor layer 121. In this case, the second electrode 130 may be insulated from the second type semiconductor layer 123 by the insulating layer 125. The separator 120 in the central portion of the multifold micro light emitting device may be provided through the oxide layer 126 from the second electrode 130.

Figure 10:
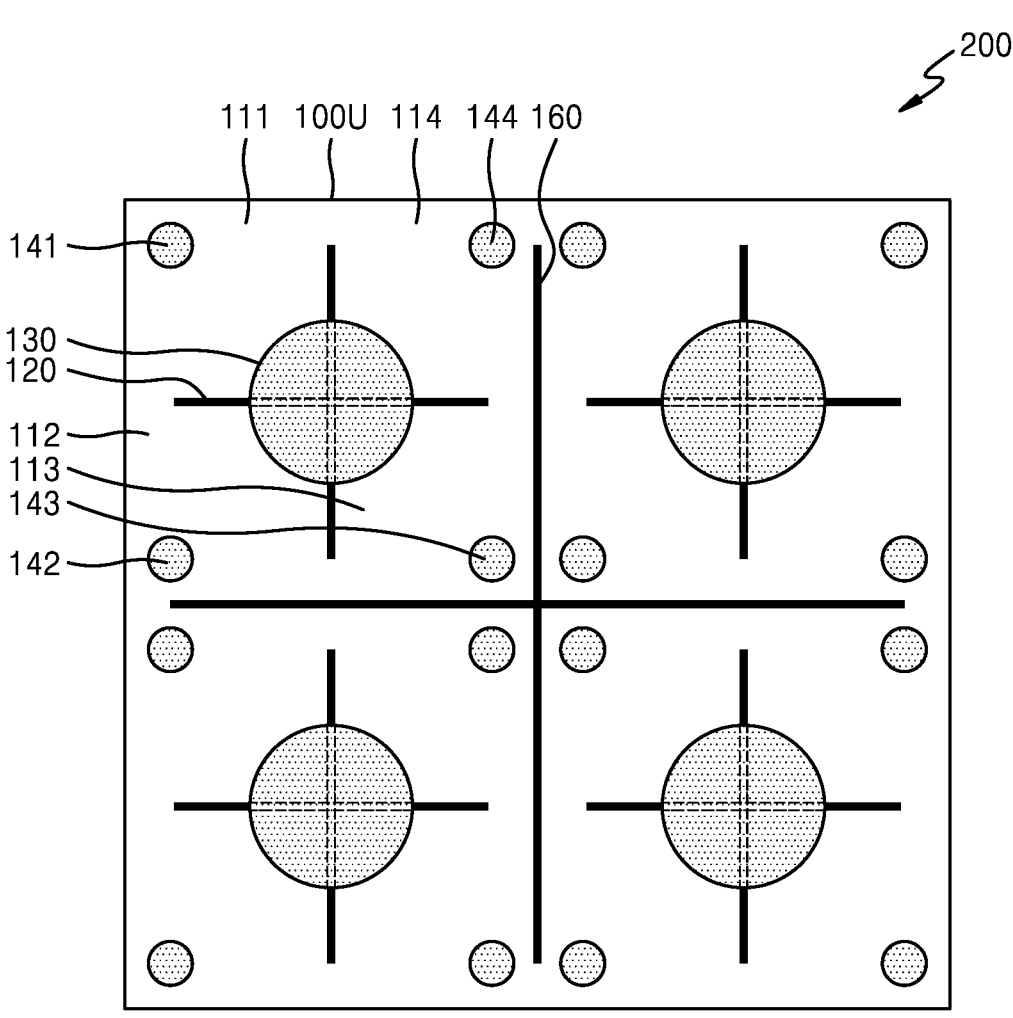
FIG. 10 illustrates an example in which a multifold micro light emitting device has a 4×4 arrangement structure according to an example embodiment.

FIG. 10 illustrates an example in which a multifold micro light emitting device has a 4×4 sub pixel structure. That is, a plurality of sub light emitting devices may have a 4×4 arrangement structure.

A multifold micro light emitting device 200 may include a plurality of multifold micro light emitting device units 100U. The multifold micro light emitting device unit 100U is substantially the same as the multifold micro light emitting device 100 described with reference to FIG. 1, and thus, a detailed description thereof is omitted. Alternatively, other multifold micro light emitting devices described with reference to FIGS. 2 to 9 may also be applied as the multifold micro light emitting device unit 100U. Each of the plurality of multifold micro light emitting device units 1000 may have, for example, a 2×2 arrangement structure, and another separator 160 may be provided between the plurality of multifold micro light emitting device units 100U. The other separator 160 may have a barrier rib structure or a separation hole structure to separate and electrically separate the plurality of multifold micro light emitting device units 100U. The other separator 160 may have, for example, a cross-shaped barrier rib structure or a cross-shaped separation hole structure. The other separator 160 may be spaced apart from the outer boundary of the multifold micro light emitting device 200 by a certain distance.

According to an example embodiment, the plurality of multifold micro light emitting device units 1000 may be separated by the other separators 160 to have a single chip structure. As above, when the plurality of multifold micro light emitting device units 100U are implemented as a single chip structure, a display apparatus to be described below may transfer a large number of sub light emitting devices 111, 112, 113, and 114 to a transfer substrate at once. The size of the multifold micro light emitting device 200 is relatively larger than the size of one of the plurality of sub light emitting devices 111, 112, 113, and 114, and thus the multifold micro light emitting device 200 may be easily transferred to the transfer substrate, and increase a transfer yield.

Although the 4×4 sub pixel structure is shown in the example embodiment illustrated in FIG. 10, it is also possible to configure the multifold micro light emitting device 200 to have a structure of a larger number of sub pixels according to another example embodiment.

Figure 11:
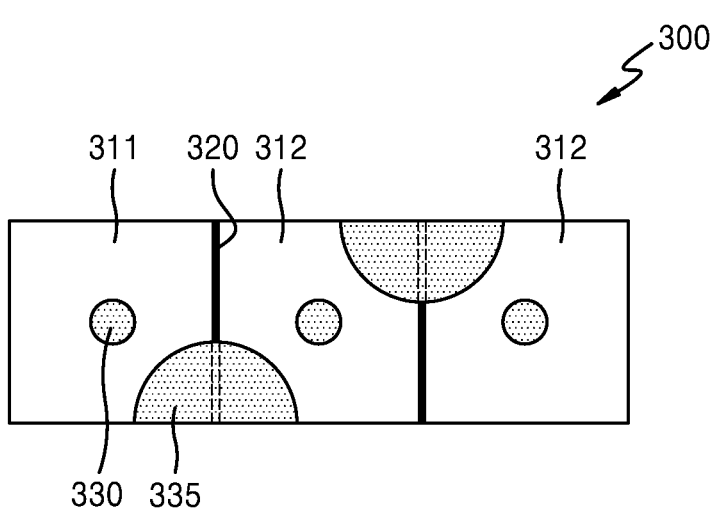
FIG. 11 illustrates an example in which a multifold micro light emitting device has a 3×1 arrangement structure according to an example embodiment.

FIG. 11 illustrates an example in which a multifold micro light emitting device has a 1×3 arrangement structure according to an example embodiment. A multifold micro light emitting device 300 may include a first sub light emitting device 311, a second sub light emitting device 312, and a third sub light emitting device 313. The first sub light emitting device 311, the second sub light emitting device 312, and the third sub light emitting device 313 may be separated by a separator 320. Each of the first sub light emitting device 311, the second sub light emitting device 312, and the third sub light emitting device 313 may include a first electrode 330 and a second electrode 335 applying a voltage to adjacent sub light emitting devices in common. The second electrode 335 may have a semicircular cross-section. The multifold micro light emitting device 300 may have a vertical electrode structure or a horizontal electrode structure.

As described above, the multifold micro light emitting device 300 according to an example embodiment may be configured such that a plurality of sub light emitting devices have a single chip structure by the separator 320.

Figure 12:
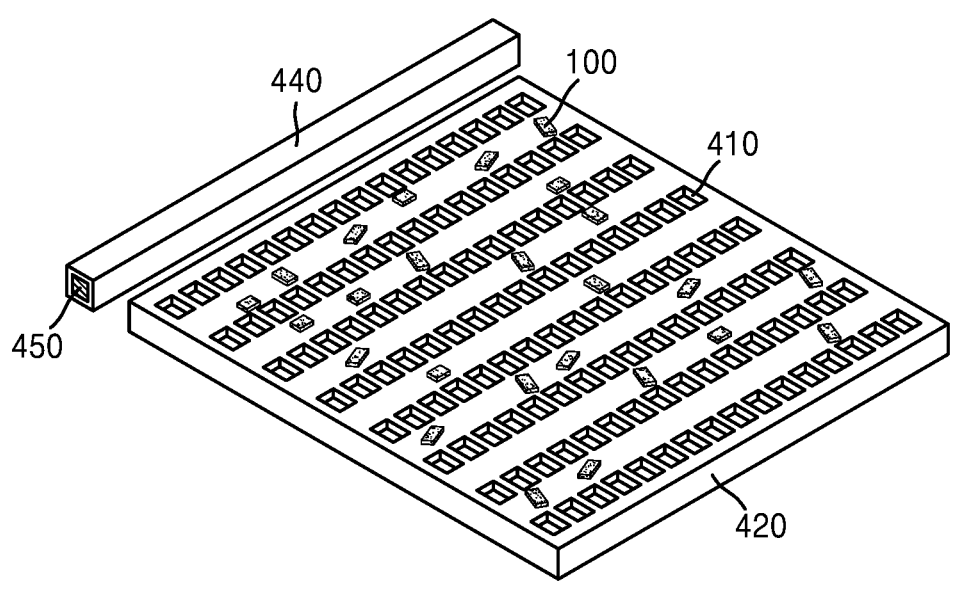
FIG. 12 is a diagram illustrating transferring a multifold micro light emitting device according to an example embodiment to a transfer substrate.

FIG. 12 illustrates transferring a multifold micro light emitting device to a transfer substrate according to an example embodiment. Hereinafter, a method of transferring a multifold micro light emitting device by a wet transfer method is described.

A transfer substrate 420 may include a plurality of wells 410. The transfer substrate 420 may be provided as a single layer or may include a plurality of layers. Each of the plurality of wells 410 may be provided to hold the multifold micro light emitting device 100. The multifold micro light emitting device 100 may include various types of sub light emitting devices each having a micro size, and the micro size may be equal to or smaller than 1000 μm or may be equal to or smaller than 200 μm. The multifold micro light emitting device 100 may include, for example, a light emitting diode (LED), a complementary metal-oxide semiconductor (CMOS), a CMOS image sensor (CIS), a vertical-cavity surface-emitting laser (VCSEL), a photo diode (PD), a memory device, a 2 dimensional (2D) material device, etc. A 2D material may be graphene or carbon nanotube (CNT).

According to an example embodiment, a liquid is supplied to the wells 410. Any type of liquid may be used as long as the liquid does not corrode or damage the multifold micro light emitting device 100. The liquid may include, for example, one or a combination of group including water, ethanol, alcohol, polyol, ketone, halocarbon, acetone, flux, and organic solvent. The organic solvent may include, for example, isopropyl alcohol (IPA). The usable liquid is not limited thereto and various changes are possible.

Various methods of supplying the liquid to the wells 410 may be used, such as a spray method, a dispensing method, an inkjet dot method, or a method of flowing the liquid to the transfer substrate 420. The amount of liquid supplied may be adjusted in various ways to fit into the wells 410 or overflow from one or more of the wells 410.

A plurality of multifold micro light emitting devices 100 are supplied to the transfer substrate 420. The multifold micro light emitting device 100 may be directly sprayed on the transfer substrate 420 without any other liquid or may be supplied in a state included in a suspension. As a method of supplying the multifold micro light emitting device 100 included in the suspension, a spray method, a dispensing method of dropping liquid drop by drop, an inkjet dot method of discharging liquid like a printing method, and a method of flowing the suspension onto the transfer substrate 420, etc. may be used in various ways.

The transfer substrate 420 is scanned with an absorber 440 capable of absorbing liquid. The absorber 440 suffices as long as it is a material capable of absorbing liquid, and its shape or structure is not limited. The absorber 440 may include, for example, fabric, tissue, polyester fiber, paper, or a wiper. The absorber 440 may be used alone without any other auxiliary equipment, but is not limited thereto, and may be coupled to a support 450 to conveniently scan the transfer substrate 420. The support 450 may have various shapes and structures suitable for scanning the transfer substrate 420. The support 450 may have a form such as, a rod, a blade, a plate, or a wiper. The absorber 440 may be provided on either side of the support 450 or may wrap around the support 450.

The absorber 440 may scan the transfer substrate 420 while pressing the transfer substrate 420 with an appropriate pressure. Scanning may include an operation in which the absorber 440 is in contact with the transfer substrate 420 and absorbs liquid while passing through the plurality of wells 410. Scanning may be performed in various ways such as a sliding method, a rotating method, a translating motion method, a reciprocating motion method, a rolling method, a spinning method, and/or a rubbing method of the absorber 440, and may include both a regular method and an irregular method. Scanning may be performed by moving the transfer substrate 420 instead of moving the absorber 440, and scanning of the transfer substrate 420 may be also performed in a sliding method, a rotating method, a translating motion method, a reciprocating motion method, a rolling method, a spinning method, and/or a rubbing method. Scanning may also be performed by cooperation of the absorber 440 and the transfer substrate 420.

The multifold micro light emitting device 100 includes a plurality of sub light emitting devices, and thus, a transfer operation may be performed quickly and efficiently when the multifold micro light emitting device 100 is transferred to the transfer substrate 420. In FIG. 12, the transfer method has been described using the multifold micro light emitting device 100 as an example, but the same may be applied to various multifold light emitting devices described with reference to FIGS. 2 to 11.

A wet transfer method has been described above as the transfer method of the multifold micro light emitting device 100, but a dry transfer method or a pick-and-place transfer method is also used.

Figure 13:
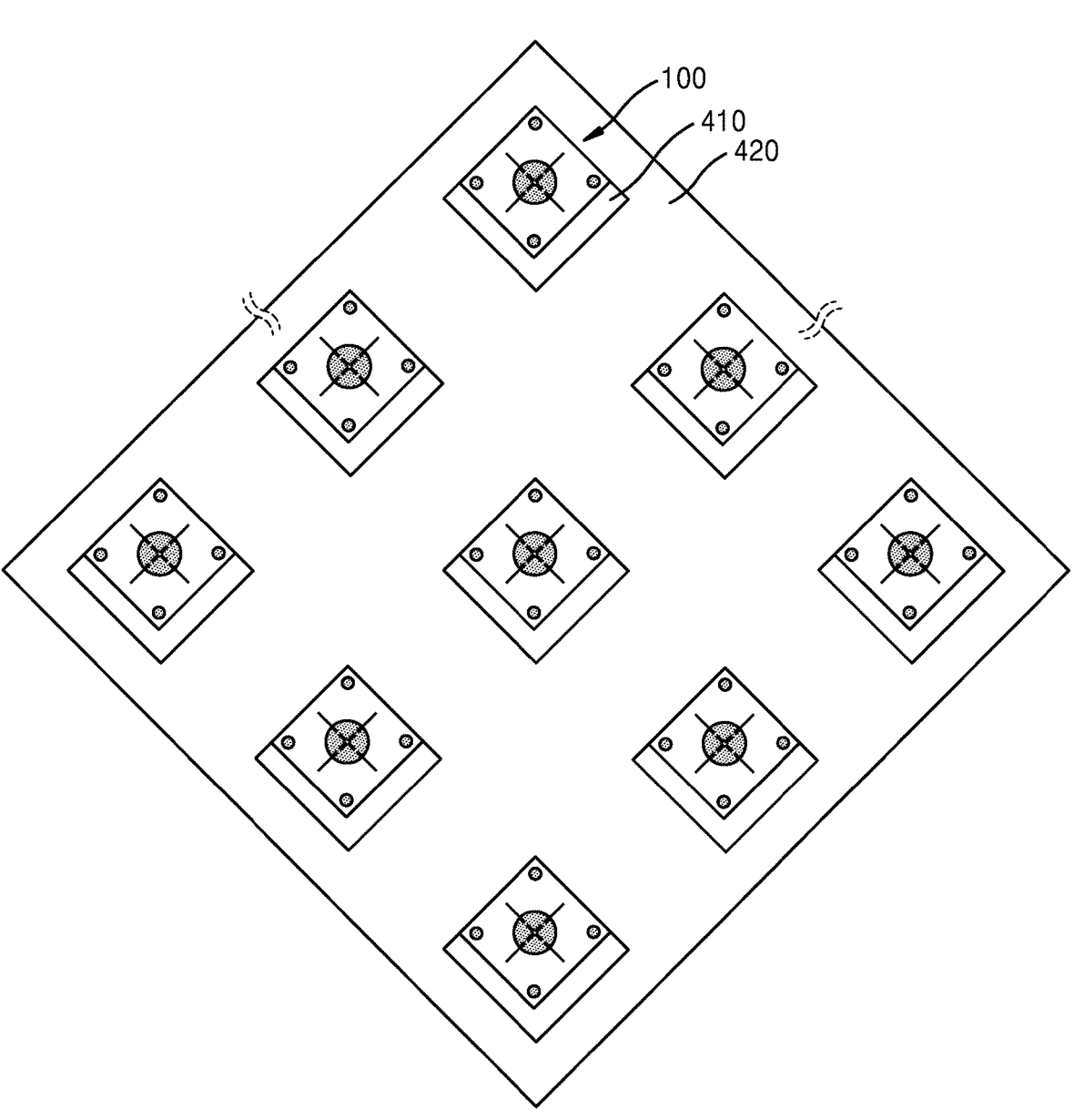
FIG. 13 illustrates a state in which a multifold micro light emitting device according to an example embodiment is transferred to a transfer substrate.

FIG. 13 is a plan view illustrating a state in which the multifold micro light emitting device 100 is transferred to the transfer substrate 420. The multifold micro light emitting devices 100 are aligned in the wells 410. A display apparatus may be manufactured by transferring the multifold micro light emitting device 100 transferred to the transfer substrate 420 to a driving substrate to be described below. Alternatively, the transfer substrate 420 itself may function as a driving substrate including a driving circuit for driving the multifold micro light emitting device 100.

Figure 14A:
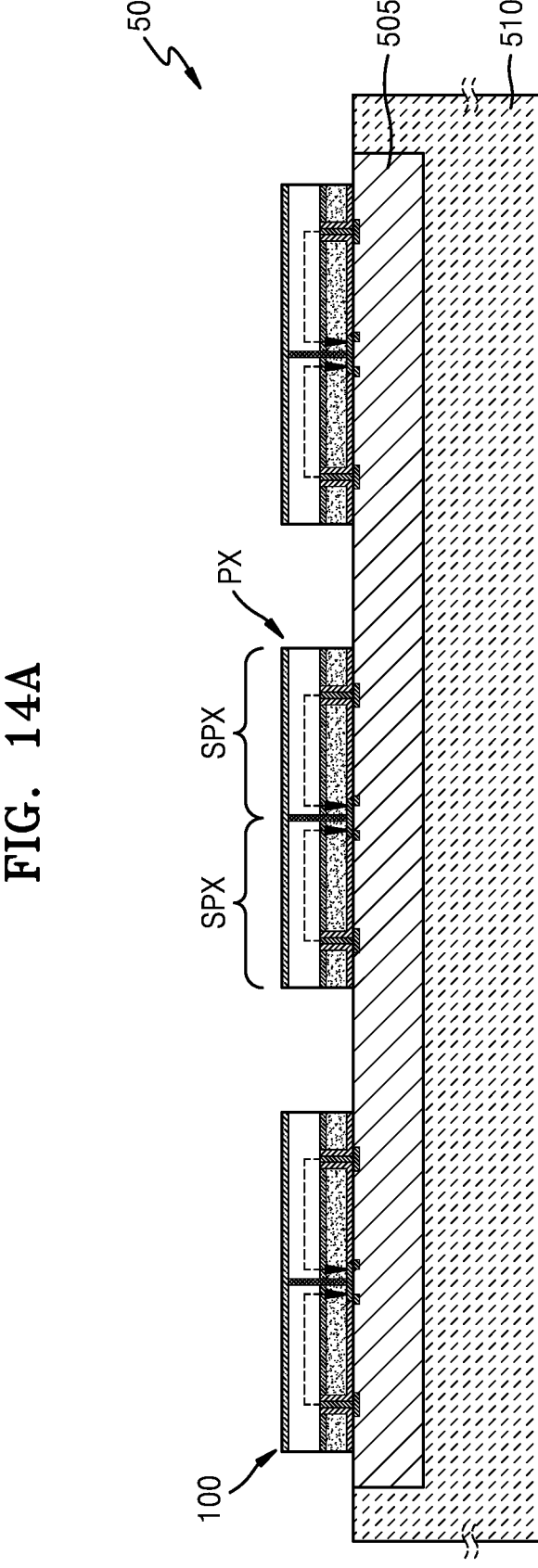
FIG. 14A illustrates a display apparatus according to an example embodiment.

FIG. 14A illustrates a display apparatus according to an example embodiment.

A display apparatus 500 may include a driving substrate 510 including a driving circuit 505 and the multifold micro light emitting device 100 bonded to the driving substrate 510. The driving substrate 510 may be a backplane substrate. The multifold micro light emitting device 100 itself may constitute one pixel PX or a plurality of pixels PX. The pixel PX may include a plurality of sub pixels SPX. Those described with reference to FIGS. 1 to 11 may be applied to the multifold micro light emitting device 100. The driving circuit 505 may include a thin film transistor (TFT). TFTs may be classified into amorphous silicon, polysilicon, single crystal silicon, and oxide transistors according to semiconductor materials of transistors, and each sub pixel may display an image by controlling light emission on/off and light emission intensity through a combination of transistors. In the display apparatus 500, the micro light emitting device 100 may be driven for each sub pixel by a TFT-based current supply, and various form factors may be implemented based on the stability of the micro light emitting device 100 which is an inorganic material and may have resistance to deterioration.

As described with reference to FIGS. 12 and 13, the display apparatus 500 may be manufactured by again transferring the multifold micro light emitting device 100 transferred to the transfer substrate 420 to the driving substrate 510, thereby simplifying a transfer process and a bonding process compared to the case of transferring a single sub light emitting device, and the size of a sub light emitting device of the multi-fold micro light emitting device 100 may be reduced compared to the case of using the single sub light emitting device, thereby increasing the resolution.

Figure 14B:
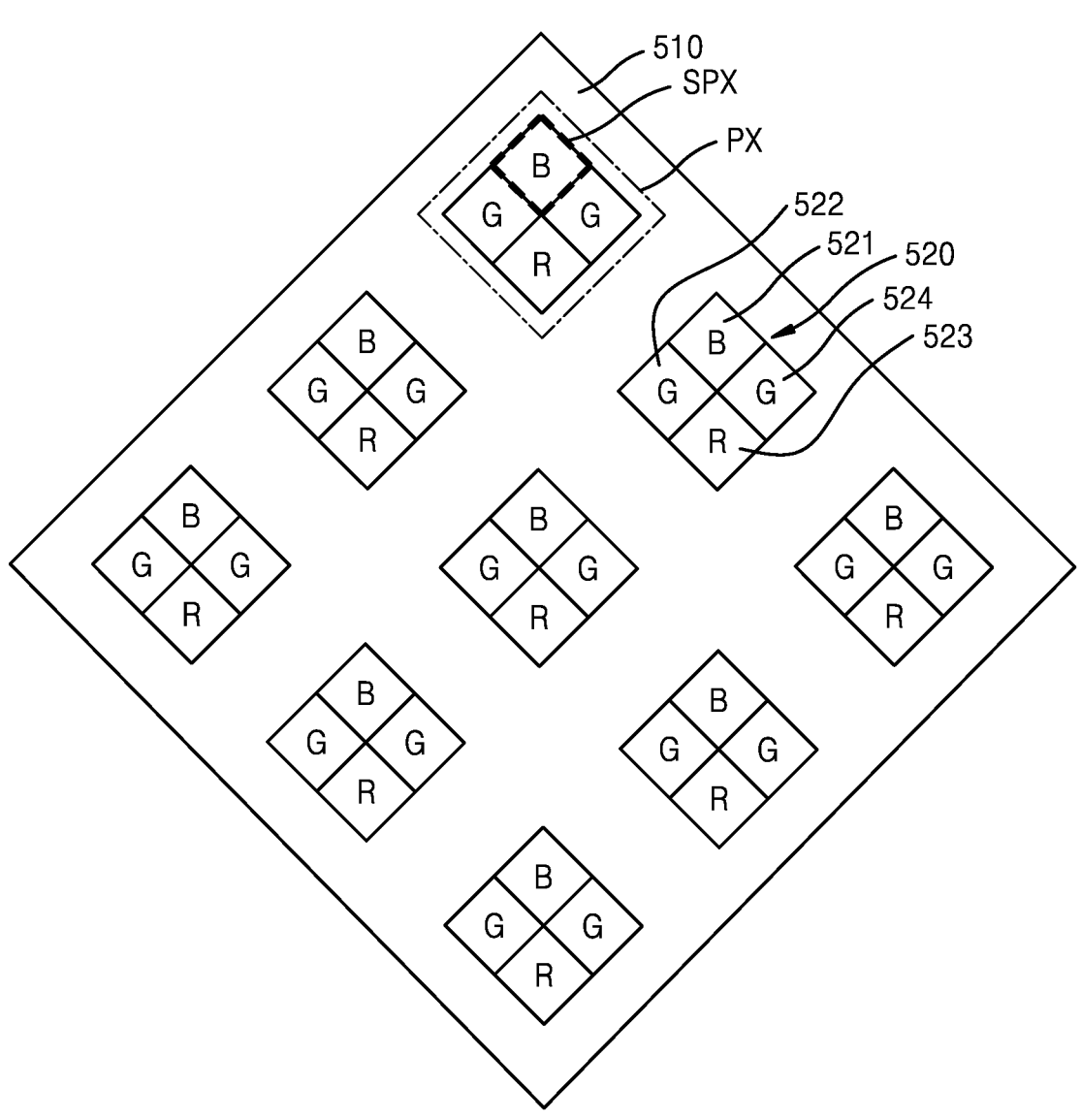
FIG. 14B illustrates an example in which a color conversion layer is further provided in the display apparatus shown in FIG. 14A.

FIG. 14B illustrates an example in which a color conversion layer 520 is further provided in the display apparatus 500 shown in FIG. 14A. When the multifold micro light emitting device 100 is applied to the display apparatus 500, full color may be implemented based on red, green, and blue image information for each pixel in a subsequent process.

The display apparatus 500 may include a plurality of pixels PX, and each of the plurality of pixels PX may include a plurality of sub pixels SPX. In an embodiment, each of the sub light emitting devices 111, 112, 113, and 114 of the multifold micro light emitting device 100 may emit blue light. For example, each of the plurality of pixels PX may include a blue sub pixel displaying a blue color, a green sub pixel displaying a green color, and a red sub pixel displaying a red color.

The color conversion layer 520 may include, for example, a blue conversion layer 521 converting light emitted from the multifold micro light emitting device 100 into blue light B, a green conversion layer 522 converting the light into green light G, a red conversion layer 523 converting the light into red light R, and a green conversion layer 524 converting the light into the green light G. Alternatively, a color conversion layer corresponding to only the red sub pixel and the green sub pixel may be provided, and a color conversion layer may not be separately provided with respect to the blue sub pixel.

The color conversion layer 520 may include quantum dots. A quantum dot which is an inorganic material having a size of several nm may have an energy bandgap of a specific wavelength and emit light of a different wavelength when absorbing light of higher energy than the energy bandgap. The quantum dot may have a narrow light emitting wavelength band, thereby increasing color reproducibility of a display apparatus. For example, the color conversion layer 520 may have a film form in which quantum dots are distributed on a photoresist. The quantum dot may have a core-shell structure having a core portion and a shell portion, or may have a particle structure without a shell. The core-shell structure may be a single-shell or multi-shell structure, for example, a double-shell structure.

The quantum dot may include an II-VI group series semiconductor, an III-V group series semiconductor, an IV-VI group series semiconductor, an IV group series semiconductor, and/or a graphene quantum dot. The quantum dot may include, for example, Cd, Se, Zn, S, and/or InP, and may have a diameter equal to or less than tens of nm, for example, equal to or less than about 10 nm. The quantum dot may emit the green light G or the red light R when excited by the blue light B, according to its material or size.

FIGS. 15 to 22 are diagrams illustrating a manufacturing method of a multifold micro light emitting device according to an example embodiment.

Figure 15:
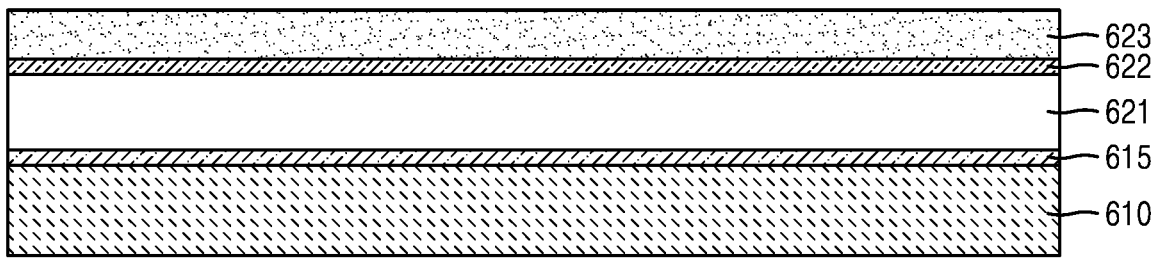
FIGS. 15 to 22 are diagrams illustrating a manufacturing method of a multifold micro light emitting device according to an example embodiment.

Referring to FIG. 15, a first type semiconductor layer 621, an active layer 622, and a second type semiconductor layer 623 may be deposited on a substrate 610. The substrate 610 may be, for example, a silicon substrate, a sapphire substrate, or a glass substrate. However, the substrate 610 is not limited thereto and various epi-substrates may be used. The first type semiconductor layer 621 may include, for example, an n-type semiconductor layer. The first type semiconductor layer 621 may include an n-GaN layer. The active layer 622 may have a multi-quantum well (MQW) or single-quantum well (SQW) structure. The active layer 622 may include an III-V group series semiconductor, for example, GaN. The second type semiconductor layer 623 may include a p-type semiconductor layer. A buffer layer 615 may be formed between the substrate 610 and the first type semiconductor layer 621. The buffer layer 615 may include AlN. According to an example embodiment, the buffer layer 615 may be used to assist the growth of the first type semiconductor layer 621, the active layer 622, and the second type semiconductor layer 623, and may include AlN.

Figure 16A:
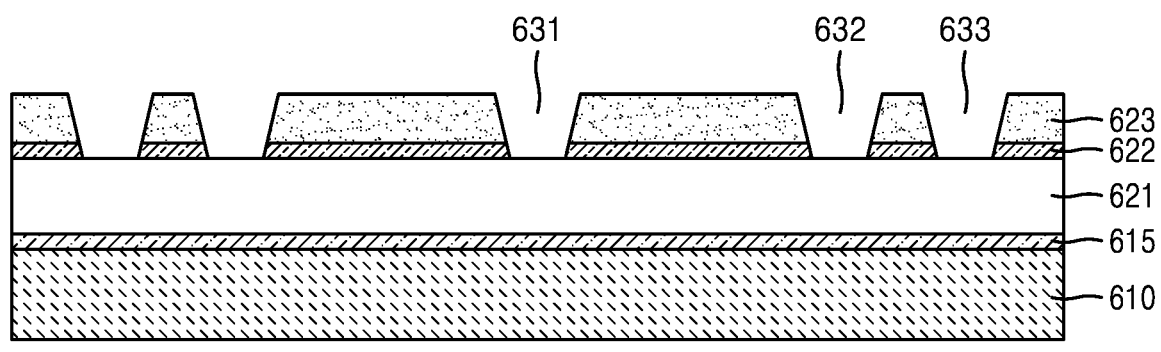
Figure 16B:
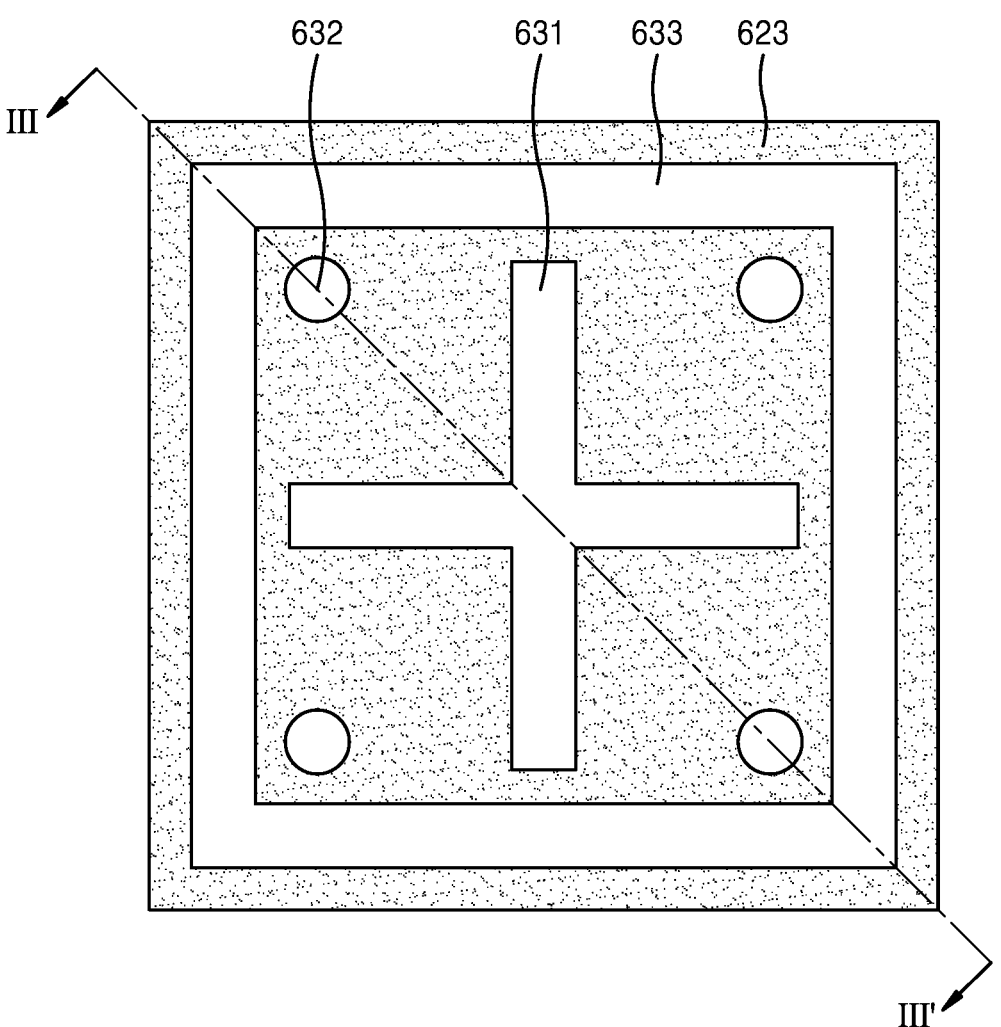

Referring to FIG. 16A, a first pattern 631, a second pattern 632, and a third pattern 633 may be formed by etching the second type semiconductor layer 623 and the active layer 622. The first pattern 631 may be a pattern for a separator, the second pattern 632 may be a pattern for a first electrode, and the third pattern 633 may be a pattern for an isolator. According to an example embodiment, the first pattern 631, the second pattern 632, and the third pattern 633 may be openings. FIG. 16B is a plan view of FIG. 16A, and FIG. 16A is a cross-sectional view taken along line III-Ill' of FIG. 16B. Referring to FIG. 16B, the first pattern 631 may have a cross-shaped hole shape, the second pattern 632 may have a line-shaped hole shape, and the third pattern 633 may have a square ring hole shape. However, the shapes of the first pattern 631, the second pattern 632, and the third pattern 633 are not limited thereto.

Figure 17:
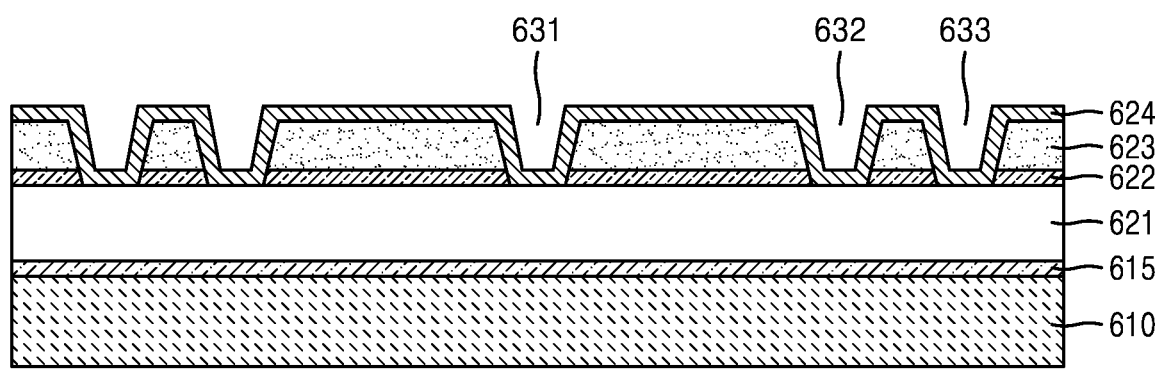

Referring to FIG. 17, an insulating layer 624 may be deposited on the second type semiconductor layer 623.

Figure 18:
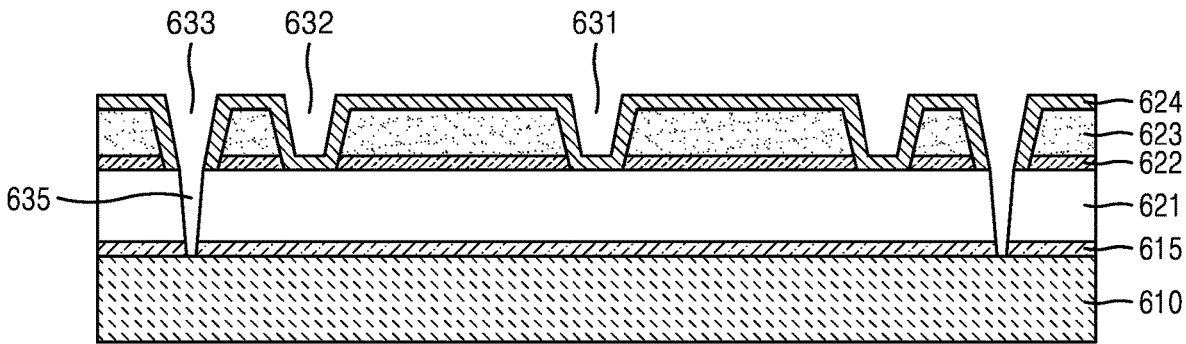

Further, referring to FIG. 18, an isolator 635 may be formed by further etching the insulating layer 624, the first type semiconductor layer 621, and the buffer layer 615 in a region corresponding to the third pattern 633. As will be described below, the isolator 635 is for separating a light emitting device stack structure formed on a wafer into multifold micro light emitting device units.

Figure 19:
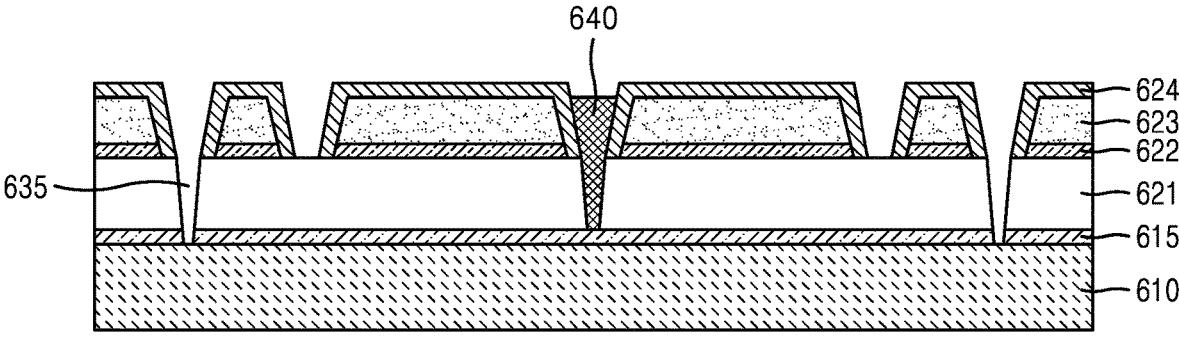

Referring to FIG. 19, the insulating layer 624 and the first type semiconductor layer 621 in a region corresponding to the first pattern 631 may be further etched, and a separator 640 may be formed in an etched area. The separator 640 may include an insulator having a light absorption or reflection characteristic. The separator 640 may include at least one of a black matrix photoresist, an oxide, or a distributed Bragg reflector. The oxide may include $TiO_2$, $SiO_2$, or $AlO_x$. As shown in FIG. 16B, the first pattern 631 is formed at a certain distance from the third pattern 633 so that the first pattern 631 does not meet the third pattern 633, the separator 640 formed in the region corresponding to the first pattern 631 may be provided apart from the isolator 635.

Figure 20:
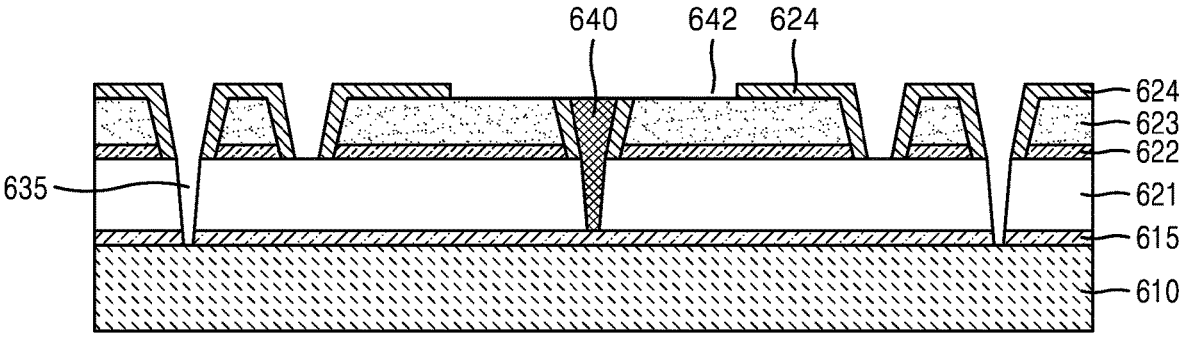
Figure 21:
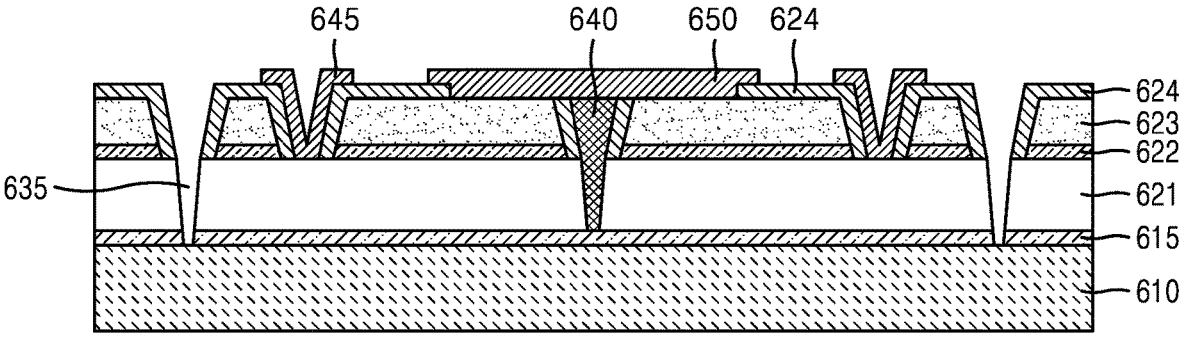

Referring to FIG. 20, a fourth pattern 642 may be formed by etching the insulating layer 624. The fourth pattern 642 may partially overlap the separator 640. The fourth pattern 642 may be a second electrode pattern. Referring to FIG. 21, a first electrode 645 may be deposited on the second pattern 632 and a second electrode 650 may be deposited on the fourth pattern 642. The first electrode 645 may be divided into regions separated by the separator 640, and the second electrode 650 may be commonly positioned in the regions separated by the separator 640. The first electrode 645 and the second electrode 650 may include Ag, Au, Al, Cr, Ni, or alloys thereof. However, the first electrode 645 and the second electrode 650 are not limited thereto.

Figure 22:
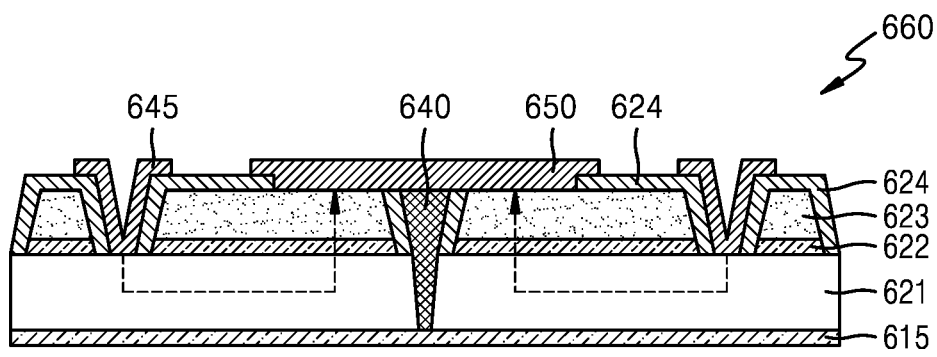

Referring to FIG. 22, the substrate 610 may be removed using a chemical lift-off method. As the substrate 610 is removed, a multifold micro light emitting device 660 may be separated into a single chip unit along the isolator 635. The isolator 635 may be a boundary for separating a micro light emitting device array manufactured on the wafer into the multifold micro light emitting device 660.

FIGS. 23 to 31 are diagrams illustrating a manufacturing method of a multifold micro light emitting device according to another example embodiment.

Figure 23:
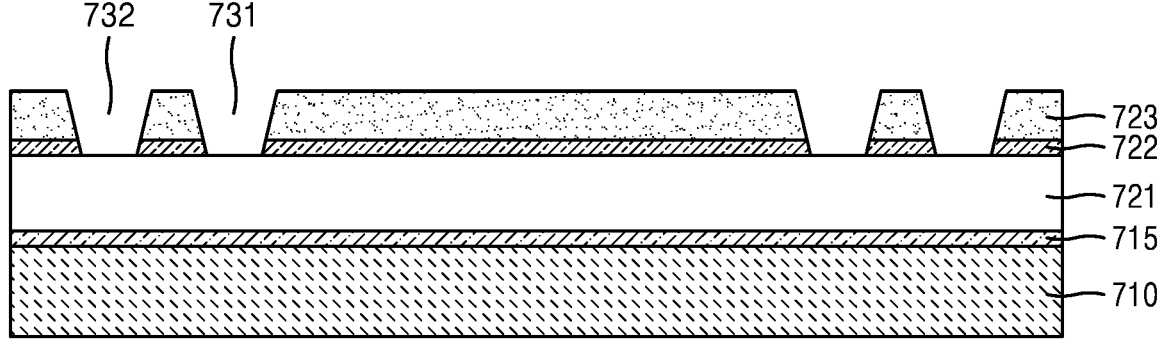
FIGS. 23 to 31 are diagrams illustrating a manufacturing method of a multifold micro light emitting device according to another example embodiment.

Referring to FIG. 23, a buffer layer 715, a first type semiconductor layer 721, an active layer 722, and a second type semiconductor layer 723 may be deposited on a substrate 710, and a first pattern 731 and a second pattern 732 may be formed by etching the second type semiconductor layer 723 and the active layer 722. The first pattern 731 may be a pattern for a first electrode, and the second pattern 732 may be a pattern for an isolator. The first pattern 731 may be formed as many as the number of sub light emitting devices to be included in one multifold micro light emitting device. The second pattern 732 may be a boundary region for separating the multifold micro light emitting devices in chip units on a wafer and may have a closed loop shape. For example, the second pattern 732 may include a rectangular closed loop shape or a circular closed loop shape.

Figure 24:
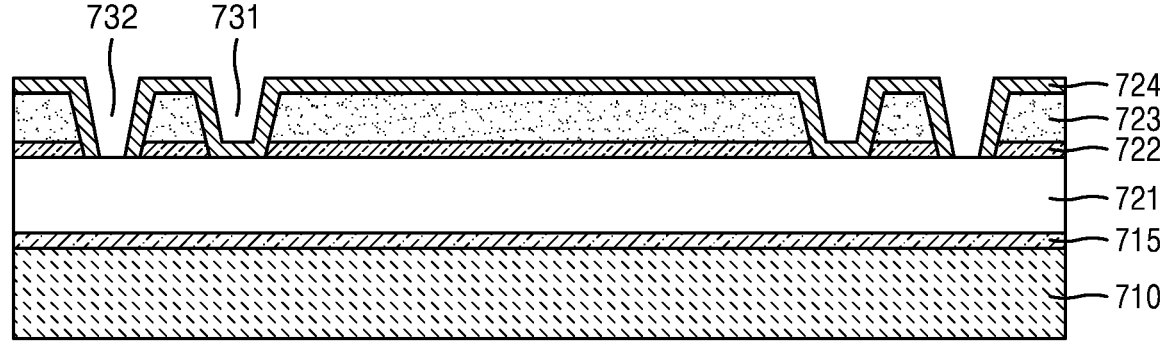
Figure 25:
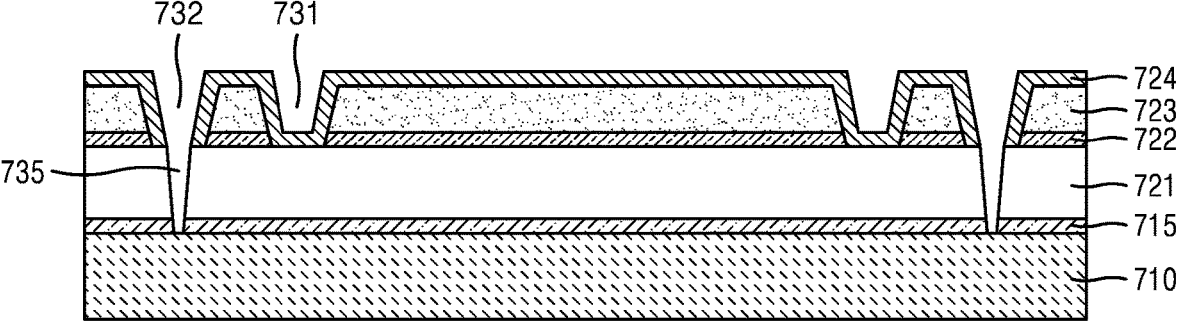

Referring to FIG. 24, an insulating layer 724 may be deposited on the second type semiconductor layer 723. Further, referring to FIG. 25, an isolator 735 may be formed by etching the insulating layer 724 and the first type semiconductor layer 721 in a region corresponding to the second pattern 732. The isolator 735 may include a closed-loop separation space or a closed-loop hole structure.

Figure 26:
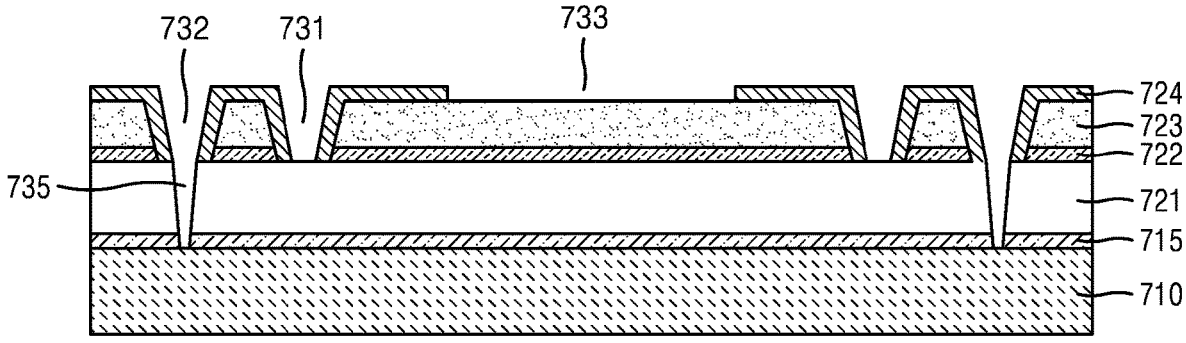

Referring to FIG. 26, the third pattern 733 may be formed by etching the insulating layer 724. The third pattern 733 may be a second electrode pattern.

Figure 27:
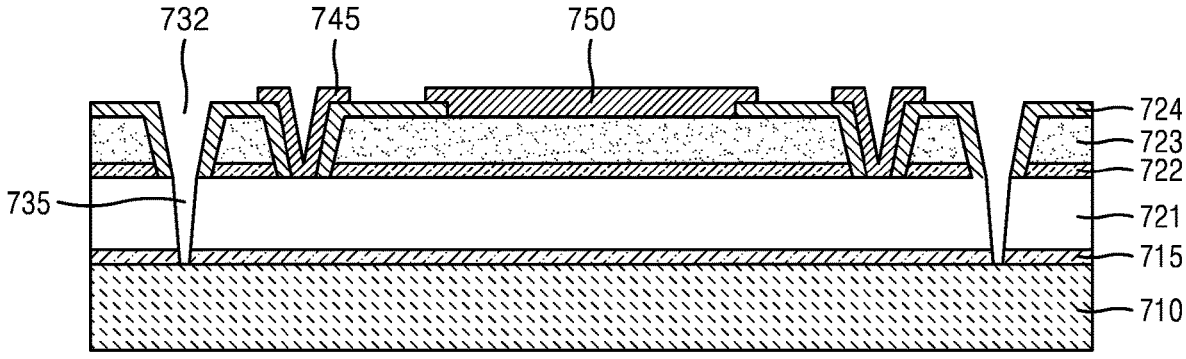
Figure 28:
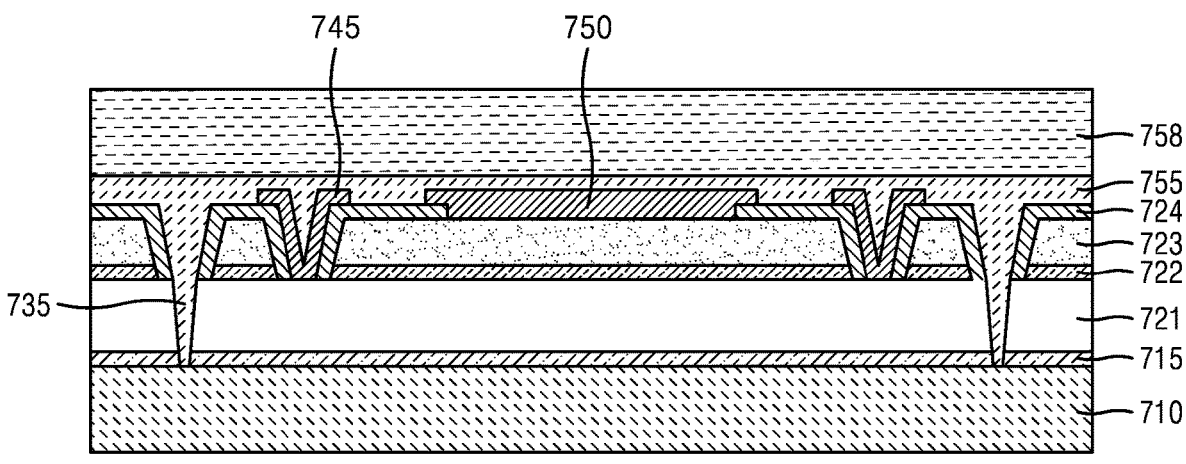

Referring to FIG. 27, a first electrode 745 may be formed on the first pattern 731 and a second electrode 750 may be formed on the third pattern 733. Referring to FIG. 28, an adhesive layer 755 may be deposited to cover the first electrode 745 and the second electrode 750, and a handling substrate 758 may be formed on an adhesive layer 755.

Figure 29:
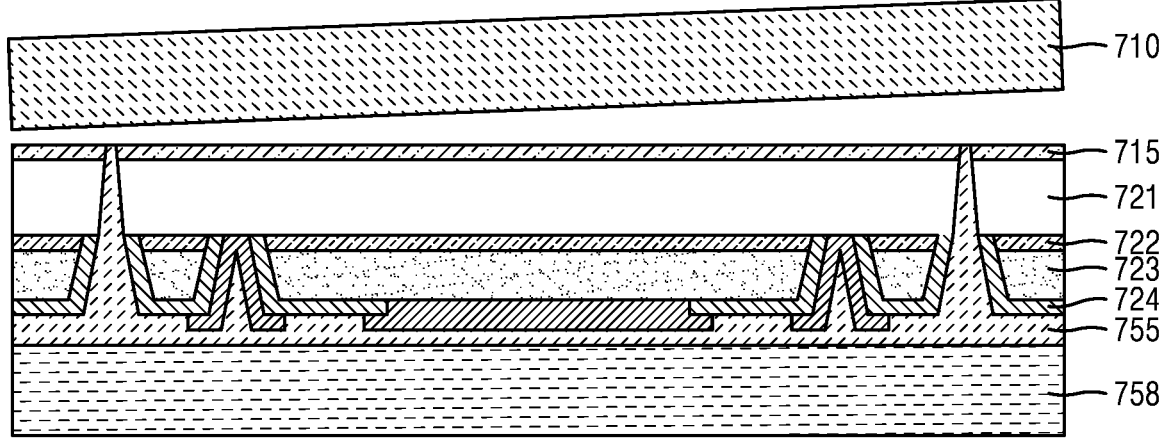

FIG. 29 illustrates a state in which a structure shown in FIG. 28 is turned upside down. Referring to FIG. 29, the substrate 710 may be separated by a chemical lift-off method.

Figure 30:
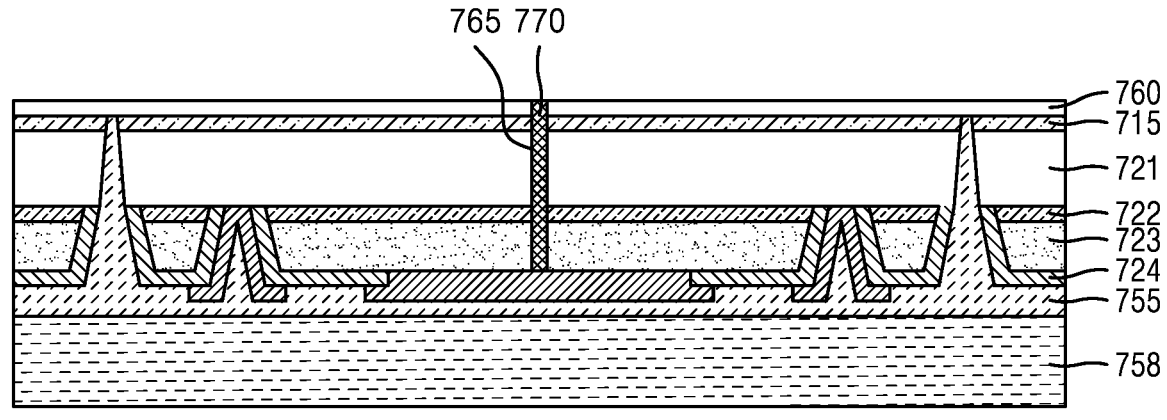

Referring to FIG. 30, a backside oxide layer 760 may be deposited on the buffer layer 715. In addition, a separator hole 765 may be formed by etching the backside oxide layer 760, the buffer layer 715, the first type semiconductor layer 721, the active layer 722, and the second type semiconductor layer 723. A separator 770 may be formed by filling the separator hole 765 with a separator material.

Figure 31:
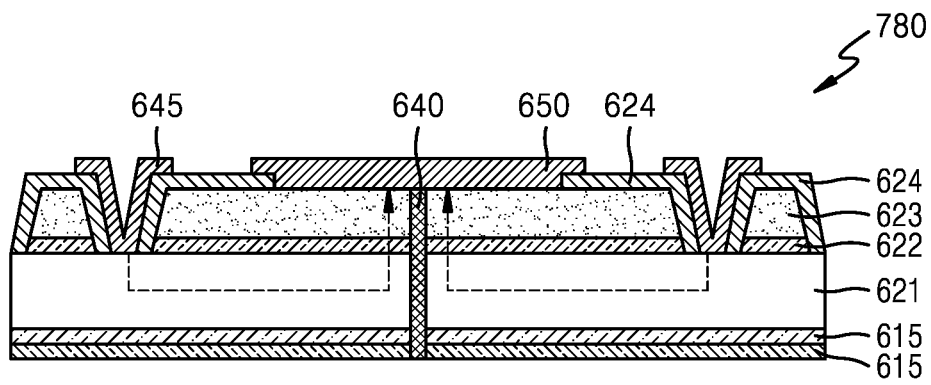

In FIG. 30, the handling substrate 758 may be removed using a chemical lift-off method. Referring to FIG. 31, as the adhesive layer 755 is removed by a chemical lift-off method, a multifold micro light emitting device 780 may be separated into a single chip unit along the isolator 735. The isolator 735 may be a boundary for separating a micro light emitting device array manufactured on the wafer into the multifold micro light emitting device 780.

As described above, in the manufacturing method of the multifold micro light emitting devices according to an example embodiment, a plurality of sub light emitting devices may be manufactured in a single chip structure.

In a manufacturing method of a display apparatus according to an example embodiment, the multifold micro light emitting devices 660 and 780 manufactured as described above may be transferred to a driving circuit including a driving substrate by any one of wet transfer, dry transfer, and pick-and-place transfer methods. The transfer method has been described with reference to FIGS. 12, 13, and 14A, and thus, a detailed description thereof is omitted. Also, referring to FIG. 14B again, the color conversion layer 520 may be formed on the multifold micro light emitting device.

The multifold micro light emitting device according to an example embodiment may solve the difficulty of handling a micro light emitting device in the transfer operation due to the size reduction of the micro light emitting device following the increase in the resolution of the display apparatus, and the difficulty of securing the distance between electrodes in the electrical connection with a TFT. The multifold micro light emitting device 780 allows the plurality of sub light emitting devices to be included in one chip and then transferred, thereby reducing process difficulties caused by miniaturization of the micro light emitting device 780 while maintaining high resolution.

The multifold micro light emitting device 780 including the plurality of sub light emitting devices in one chip finally includes one second electrode and first electrodes corresponding to the number of the plurality of sub light emitting devices so as to be individually driven by the TFT, thereby easily securing the distance needed between electrodes to be electrically connected to the TFT. In addition, the size of the multifold micro light emitting device 780 is maintained in a range that is easy to handle in the transfer operation, and thus, high-speed/high-yield transfer is possible with respect to high resolution. The multifold micro light emitting device according to an example embodiment may be bonded to the pole of the driving circuit of the driving substrate after being transferred to the transfer substrate. Alternatively, the multifold micro light emitting device 780 may be connected to an electrode of the TFT through a subsequent lithography process after being transferred to the transfer substrate.

Figure 32:
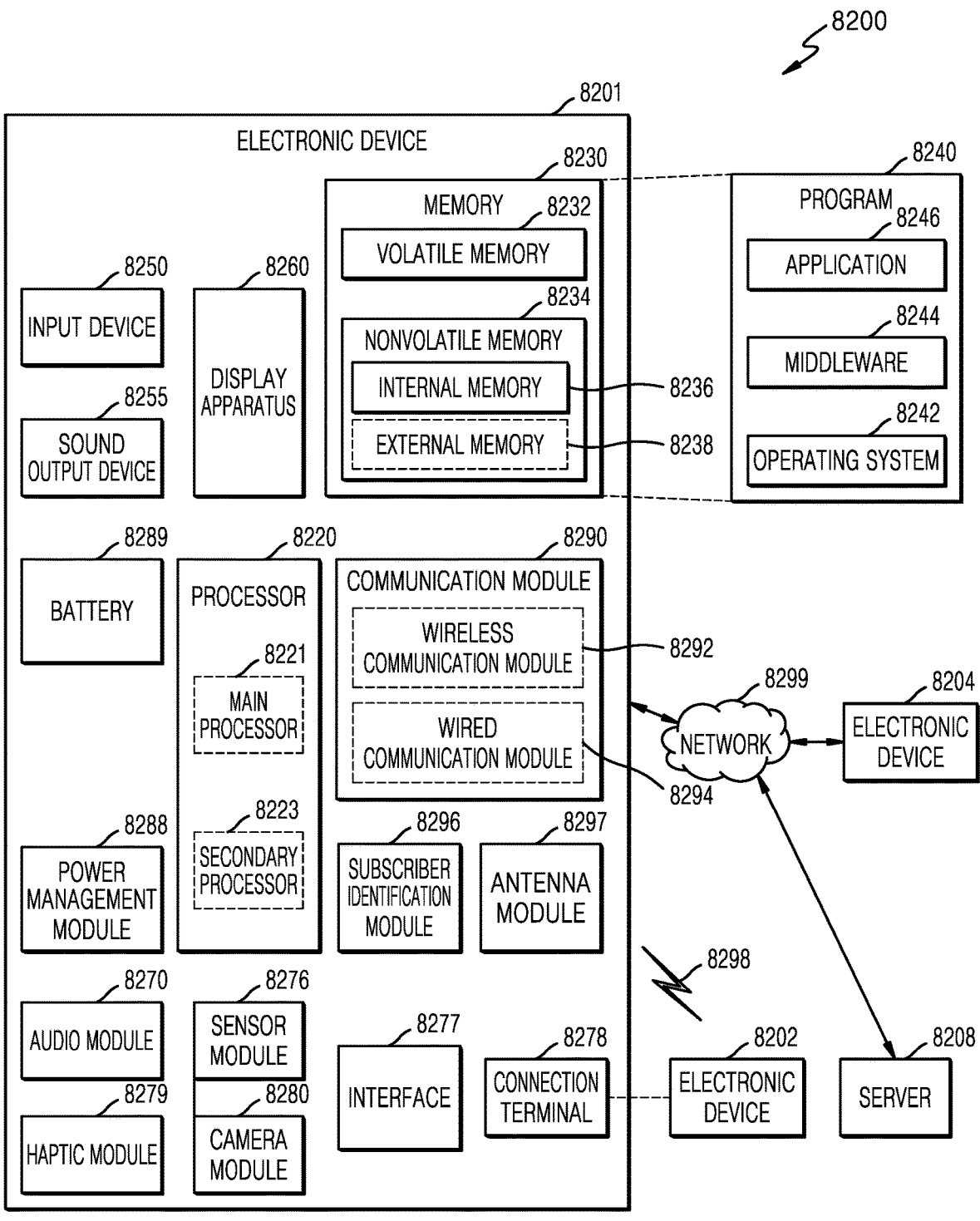
FIG. 32 is a schematic block diagram of an electronic device according to an example embodiment.

FIG. 32 is a block diagram of an electronic device including a display apparatus according to an example embodiment.

Referring to FIG. 32, an electronic device 8201 may be provided in a network environment 8200. In the network environment 8200, the electronic device 8201 may communicate with another electronic device 8202 through a first network 8298 (such as a short-range wireless communication network, and the like), or communicate with another electronic device 8204 and/or a server 8208 through a second network 8299 (such as a remote wireless communication network). The electronic device 8201 may communicate with the electronic device 8204 through the server 8208. The electronic device 8201 may include a processor 8220, a memory 8230, an input device 8250, an audio output device 8255, a display device 8260, an audio module 8270, a sensor module 8276, and an interface 8277, a haptic module 8279, a camera module 8280, a power management module 8288, a battery 8289, a communication module 8290, a subscriber identification module 8296, and/or an antenna module 8297. In the electronic device 8201, some of these components may be omitted or other components may be added. Some of these components may be implemented as one integrated circuit. For example, the sensor module 8276 (fingerprint sensor, iris sensor, illuminance sensor, etc.) may be implemented by being embedded in the display apparatus 8260 (display, etc.)

The processor 8220 may execute software (the program 8240, etc.) to control one or a plurality of other components (such as hardware, software components, etc.) of the electronic device 8201 connected to the processor 8220, and perform various data processing or operations. As part of data processing or operation, the processor 8220 may load commands and/or data received from other components (the sensor module 8276, the communication module 8290, etc.) into the volatile memory 8232, process commands and/or data stored in the volatile memory 8232, and store result data in the nonvolatile memory 8234. The nonvolatile memory 8234 may include an internal memory 8236 and an external memory 8238. The processor 8220 may include a main processor 8221 (such as a central processing unit, an application processor, etc.) and a secondary processor 8223 (such as a graphics processing unit, an image signal processor, a sensor hub processor, a communication processor, etc.) that may be operated independently or together. The secondary processor 8223 may use less power than the main processor 8221 and may perform specialized functions.

The secondary processor 8223 may control functions and/or states related to some of the components of the electronic device 8201 (such as the display apparatus 8260, the sensor module 8276, the communication module 8290, etc.) instead of the main processor 8221 while the main processor 8221 is in an inactive state (sleep state), or with the main processor 8221 while the main processor 8221 is in an active state (application execution state). The secondary processor 8223 (such as an image signal processor, a communication processor, etc.) may be implemented as part of other functionally related components (such as the camera module 8280, the communication module 8290, etc.).

The memory 8230 may store various data required by components of the electronic device 8201 (such as the processor 8220, the sensor module 8276, etc.) The data may include, for example, software (such as the program 8240, etc.) and input data and/or output data for commands related thereto. The memory 8230 may include a volatile memory 8232 and/or a nonvolatile memory 8234.

The program 8240 may be stored as software in the memory 8230 and may include an operating system 8242, a middleware 8244, and/or an application 8246.

The input device 8250 may receive commands and/or data to be used for components (such as the processor 8220, etc.) of the electronic device 8201 from outside (a user) of the electronic device 8201. The input device 8250 may include a remote controller, a microphone, a mouse, a keyboard, and/or a digital pen (such as a stylus pen).

The audio output device 8255 may output an audio signal to the outside of the electronic device 8201. The audio output device 8255 may include a speaker and/or a receiver. The speaker may be used for general purposes such as multimedia playback or recording playback, and the receiver may be used to receive incoming calls. The receiver may be combined as a part of the speaker or may be implemented as an independent separate device.

The display apparatus 8260 may visually provide information to the outside of the electronic device 8201. The display apparatus 8260 may include a display, a hologram apparatus, or a projector and a control circuit for controlling the apparatus. The display apparatus 8260 may include a display apparatus according to an example embodiment. The display apparatus 8260 may include a touch circuitry set to sense a touch, and/or a sensor circuit (such as a pressure sensor) set to measure the strength of a force generated by the touch.

The audio module 8270 may convert sound into an electrical signal, or conversely, may convert an electrical signal into sound. The audio module 8270 may acquire sound through the input device 8250 or output sound through speakers and/or headphones of the audio output device 8255, and/or other electronic devices (such as the electronic device 8202) directly or wirelessly connected to the electronic device 8201.

The sensor module 8276 may detect an operating state (such as power, temperature, and the like) of the electronic device 8201 or an external environmental state (such as a user state, and the like), and generate an electrical signal and/or data value corresponding to the detected state. The sensor module 8276 may include a gesture sensor, a gyro sensor, a barometric pressure sensor, a magnetic sensor, an acceleration sensor, a grip sensor, a proximity sensor, a color sensor, an infrared (IR) sensor, a biometric sensor, a temperature sensor, a humidity sensor, and/or an illuminance sensor.

The interface 8277 may support one or more specified protocols that may be used for the electronic device 8201 to connect directly or wirelessly with another electronic device (such as the electronic device 8202). The interface 8277 may include a High Definition Multimedia Interface (HDMI), a Universal Serial Bus (USB) interface, an SD card interface, and/or an audio interface.

The connection terminal 8278 may include a connector through which the electronic device 8201 may be physically connected to another electronic device (such as the electronic device 8202). The connection terminal 8278 may include an HDMI connector, a USB connector, an SD card connector, and/or an audio connector (such as a headphone connector).

The haptic module 8279 may convert an electrical signal into a mechanical stimulus (such as vibration, movement, etc.) or an electrical stimulus that a user may perceive through a tactile or motor sense. The haptic module 8279 may include a motor, a piezoelectric element, and/or an electrical stimulation device.

The camera module 8280 may capture a still image and a video. The camera module 8280 may include a lens assembly including one or more lenses, image sensors, image signal processors, and/or flashes. The lens assembly included in the camera module 8280 may collect light emitted from a subject that is a target of image capturing.

The power management module 8288 may manage power supplied to the electronic device 8201. The power management module 8388 may be implemented as a part of a Power Management Integrated Circuit (PMIC).

The battery 8289 may supply power to components of the electronic device 8201. The battery 8289 may include a non-rechargeable primary cell, a rechargeable secondary cell, and/or a fuel cell.

The communication module 8290 may support establishing a direct (wired) communication channel and/or a wireless communication channel, and performing communication through the established communication channel between the electronic device 8201 and other electronic devices (such as the electronic device 8202, the electronic device 8204, the server 8208, etc.) The communication module 8290 may include one or more communication processors that operate independently of the processor 8220 (such as an application processor) and support direct communication and/or wireless communication. The communication module 8290 may include a wireless communication module 8292 (such as a cellular communication module, a short-range wireless communication module, a Global Navigation Satellite System (GNSS) communication module, and the like) and/or a wired communication module 8294 (such as a local area network (LAN) communication module, a power line communication module, etc.) Among these communication modules, a corresponding communication module may communicate with other electronic devices through a first network 8298 (a short-range communication network such as Bluetooth, WiFi Direct, or Infrared Data Association (IrDA)) or a second network 8299 (a cellular network, the Internet, or a telecommunication network such as a computer network (such as LAN, WAN, etc.)) These various types of communication modules may be integrated into one component (such as a single chip, and the like), or may be implemented as a plurality of separate components (a plurality of chips). The wireless communication module 8292 may check and authenticate the electronic device 8201 in a communication network such as the first network 8298 and/or the second network 8299 using the subscriber information (such as international mobile subscriber identifier (IMSI), etc.) stored in the subscriber identification module 8296.

The antenna module 8297 may transmit signals and/or power to the outside (such as other electronic devices) or receive signals and/or power from the outside. The antenna may include a radiator made of a conductive pattern formed on a substrate (such as PCB, etc.) The antenna module 8297 may include one or a plurality of antennas. If multiple antennas are included, an antenna suitable for a communication method used in a communication network such as the first network 8298 and/or the second network 8299 may be selected from the plurality of antennas by the communication module 8290. Signals and/or power may be transmitted or received between the communication module 8290 and another electronic device through the selected antenna. In addition to the antenna, other components (such as RFIC) may be included as part of the antenna module 8297.

Some of the components are connected to each other and may exchange signals (such as commands, data, and the like) through communication method between peripheral devices (such as bus, General Purpose Input and Output (GPIO), Serial Peripheral Interface (SPI), Mobile Industry Processor Interface (MIPI), etc.)

The command or data may be transmitted or received between the electronic device 8201 and the external electronic device 8204 through the server 8208 connected to the second network 8299. The other electronic devices 8202 and 8204 may be the same or different types of devices as or from the electronic device 8201. All or some of the operations executed by the electronic device 8201 may be executed by one or more of the other electronic devices 8202, 8204, and 8208. For example, when the electronic device 8201 needs to perform a certain function or service, instead of executing the function or service itself, the electronic device 8201 may request one or more other electronic devices to perform the function or part or all of the service. One or more other electronic devices that receive the request may execute an additional function or service related to the request, and transmit a result of the execution to the electronic device 8201. For this, cloud computing, distributed computing, and/or client-server computing technology may be used.

Figure 33:
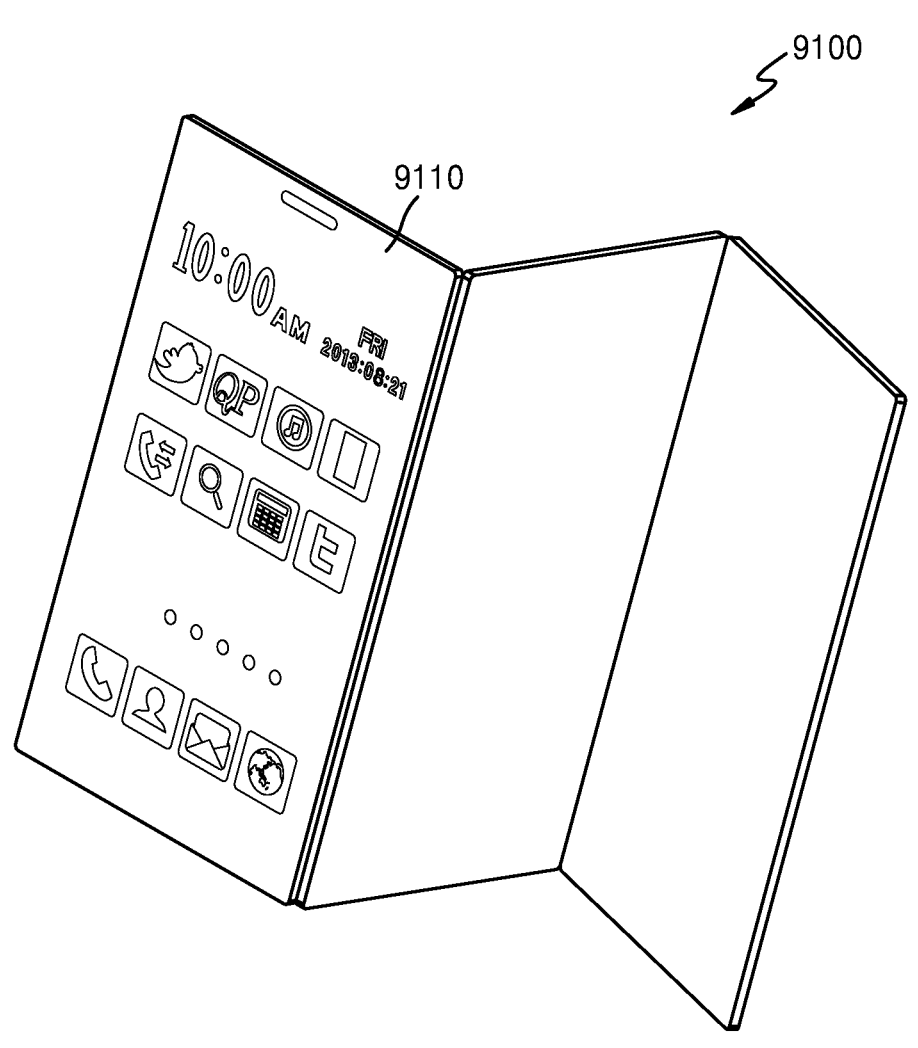
FIG. 33 illustrates an example in which a display apparatus according to an example embodiment is applied to a mobile device.

FIG. 33 illustrates an example in which a display apparatus according to an example embodiment is applied to a mobile device. The mobile device 9100 may include a display apparatus 9110, and the display apparatus 9110 may include display apparatuses according to embodiments. The display apparatus 9110 may have a foldable structure, for example, a multi foldable structure.

Figure 34:
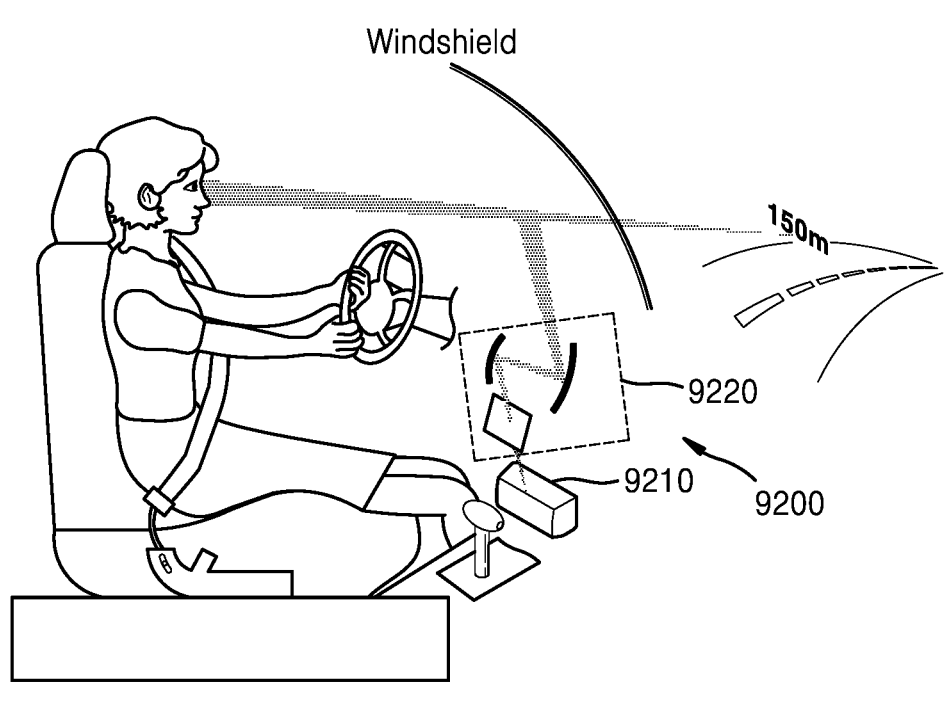
FIG. 34 illustrates an example in which a display apparatus according to an example embodiment is applied to a display apparatus for a vehicle.

FIG. 34 illustrates an example in which a display apparatus according to an example embodiment is applied to a vehicle. The display apparatus may be a vehicle head-up display apparatus 9200, and may include a display 9210 provided in an area of the vehicle, and a light path changing member 9220 that converts an optical path so that a driver may see an image generated on the display 9210.

Figure 35:
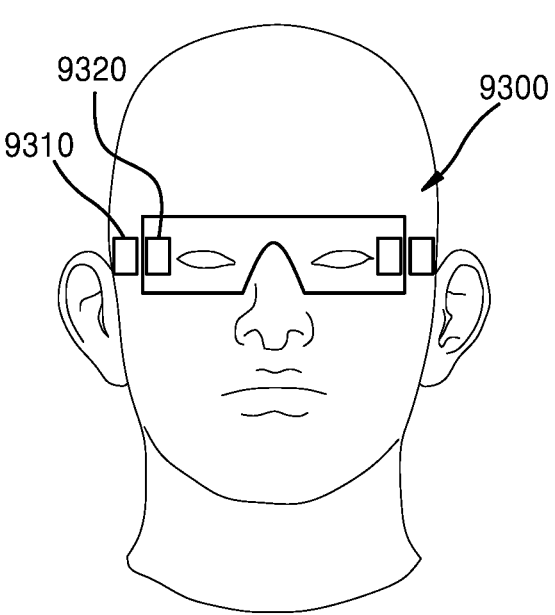
FIG. 35 illustrates an example in which a display apparatus according to an example embodiment is applied to augmented reality glasses.

FIG. 35 illustrates an example in which a display apparatus according to an example embodiment is applied to augmented reality glasses or virtual reality glasses. The augmented reality glasses 9300 may include a projection system 9310 that forms an image, and an element 9320 that guides the image from the projection system 9310 into the user's eye. The projection system 9310 may include a display apparatus according to an example embodiment.

Figure 36:
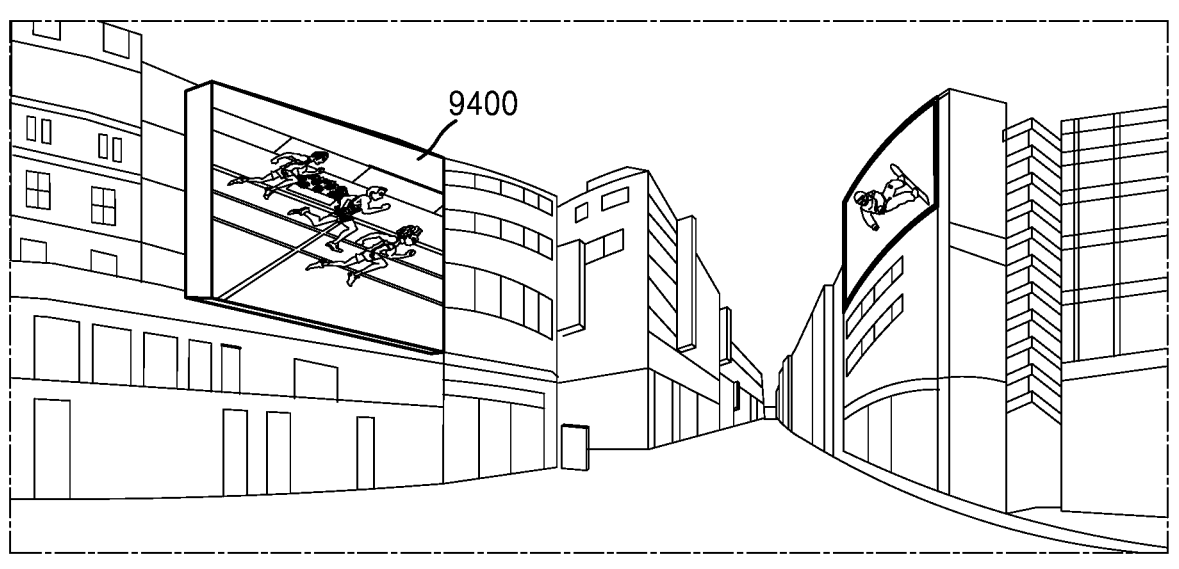
FIG. 36 illustrates an example in which a display apparatus according to an example embodiment is applied to signage.

FIG. 36 an example in which a display apparatus according to an example embodiment is applied to a large signage. A signage 9400 may be used for outdoor advertisement using a digital information display, and may control advertisement contents and the like through a communication network. The signage 9400 may be implemented, for example, through the electronic device described with reference to FIG. 32.

Figure 37:
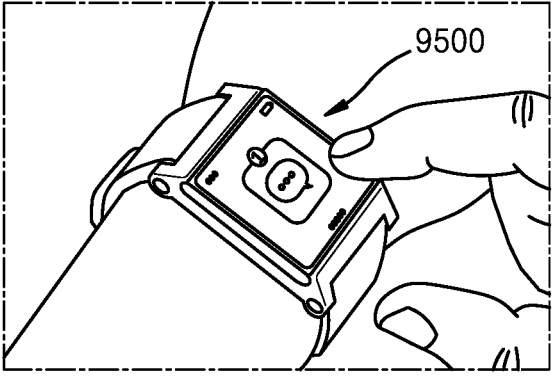
FIG. 37 illustrates an example in which a display apparatus according to an example embodiment is applied to a wearable display.

FIG. 37 illustrates an example in which a display apparatus according to an example embodiment is applied to a wearable display. The wearable display 9500 may include the above-described display substrate and microchip, and may be implemented through the electronic device described with reference to FIG. 32.

The display apparatus according to an example embodiment may also be applied to various products such as a rollable TV and a stretchable display.

In the multifold micro light emitting device according to an example embodiment, a plurality of sub light emitting devices are configured as a single chip, and thus, a required distance between electrodes may be secured even with a small sub pixel size. The display apparatus according to an example embodiment may be manufactured by transferring the multifold micro light emitting device. In addition, the manufacturing method of the multifold micro light emitting device may manufacture the plurality of sub light emitting devices in a single chip structure.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A micro light emitting device comprising:
a plurality of sub light emitting devices comprising a first type semiconductor layer, an active layer provided on the first type semiconductor layer, and a second type semiconductor layer provided on the active layer, the active layer configured to emit light;
an insulator layer provided on a first surface of the second type semiconductor layer opposite to a second surface of the second type semiconductor layer contacting the active layer;
a plurality of first electrodes, each configured to apply a voltage to the first type semiconductor layer or the second type semiconductor layer of one of the plurality of sub light emitting devices;
a second electrode configured to apply a common voltage to the first type semiconductor layer or the second type semiconductor layer of each of the plurality of sub light emitting devices; and
a separator configured to separate the plurality of sub light emitting devices from each other,
wherein the plurality of sub light emitting devices are configured as a single chip, and
wherein the second electrode overlaps only a portion of the second type semiconductor layer in a plan view.

2. The micro light emitting device of claim 1, wherein the separator is configured to electrically and optically separate the plurality of sub light emitting devices.

3. The micro light emitting device of claim 1, wherein the separator comprises an insulator having a light absorption or reflection characteristic.

4. The micro light emitting device of claim 1, wherein the separator is provided to separate the second electrode into a plurality parts.

5. The micro light emitting device of claim 1, wherein the separator comprises a cross-shaped barrier rib structure.

6. A display apparatus comprising:
a driving substrate comprising a driving circuit; and
a micro light emitting device bonded to the driving substrate,
wherein the micro light emitting device comprises:
a plurality of sub light emitting devices comprising a first type semiconductor layer, an active layer provided on the first type semiconductor layer, and a second type semiconductor layer provided on the active layer, the active layer configured to emit light;

an insulator layer provided on a first surface of the second type semiconductor layer opposite to a second surface of the second type semiconductor layer contacting the active layer;

a plurality of first electrodes, each configured to apply a voltage to the first type semiconductor layer or the second type semiconductor layer of one of the plurality of sub light emitting devices;

a second electrode configured to apply a common voltage to the first type semiconductor layer or the second type semiconductor layer of each of the plurality of sub light emitting devices; and a separator configured to separate the plurality of sub light emitting devices from each other, wherein the plurality of sub light emitting devices are configured as a single chip, and wherein the second electrode overlaps only a portion of the second type semiconductor layer in a plan view.

7. The display apparatus of claim 6, further comprising:

a color conversion layer provided on an upper portion of each of the plurality of sub light emitting devices.

8. The display apparatus of claim 6, further comprising:

a plurality of pixels, each of the plurality of pixels comprises a blue sub pixel configured to display blue color, a green sub pixel configured to display green color, and a red sub pixel configured to display red color, wherein each of the plurality of sub light emitting devices is configured to emit blue light, a green color conversion layer is provided on an upper portion of a sub light emitting device in the green sub pixel, and a red color conversion layer is provided on an upper portion of a sub light emitting device in the red sub pixel.

9. The display apparatus of claim 6, wherein the separator is configured to electrically and optically separate the plurality of sub light emitting devices.

10. The display apparatus of claim 6, wherein the separator comprises an insulator having a light absorption or reflection characteristic.

11. The display apparatus of claim 6, wherein the separator comprises a cross-shaped barrier rib structure.

12. A method of manufacturing a micro light emitting device, the method comprising:

depositing a first type semiconductor layer, an active layer, and a second type semiconductor layer on a substrate;

forming an isolation pattern, a first electrode pattern, and a separator pattern by etching the second type semiconductor layer and the active layer;

providing an insulating layer on the second type semiconductor layer, the isolation pattern, the first electrode pattern, and the separator pattern;

forming an isolator by etching the insulating layer in a first region corresponding to the isolation pattern and a first type semiconductor layer;

separating the plurality of sub light emitting devices from each other by etching the insulating layer in a second region corresponding to the separator pattern and the first type semiconductor layer and forming a separator in the second region;

forming a second electrode pattern by etching the insulating layer on an upper portion of the second type semiconductor layer with respect to an upper portion of the separator;

forming a first electrode on the first electrode pattern and forming a second electrode on the second electrode pattern; and separating the micro light emitting device comprising the plurality of sub light emitting devices into chip units through the isolator by removing the substrate, wherein the second electrode overlaps only a portion of the second type semiconductor layer in a plan view.

13. The method of claim 12, wherein the separator is configured to electrically and optically separate the plurality of sub light emitting devices.

14. The method of claim 12, wherein the separator includes an insulator having a light absorption or reflection characteristic.

15. The method of claim 12, wherein the separator is provided to separate the second electrode into a plurality parts.

16. The method of claim 12, wherein the separator includes a cross-shaped barrier rib structure.

17. A method of manufacturing a display apparatus, the method comprising:

forming a micro light emitting device including a plurality of sub light emitting devices having a first type semiconductor layer, an active layer provided on the first type semiconductor layer, and a second type semiconductor layer provided on the active layer, an insulator layer provided on a first surface of the second type semiconductor layer opposite to a second surface of the second type semiconductor layer contacting the active layer, a plurality of first electrodes, each configured to apply a voltage to the first type semiconductor layer or the second type semiconductor layer of one of the plurality of sub light emitting devices; a second electrode configured to apply a common voltage to the first type semiconductor layer or the second type semiconductor layer of each of the plurality of sub light emitting devices, and a separator configured to separate the plurality of sub light emitting devices from each other, wherein the plurality of sub light emitting devices are configured as a single chip;

transferring the micro light emitting device onto a driving substrate comprising a driving circuit using one of wet transfer, dry transfer, or pick-and-place transfer; and forming a color conversion layer on an upper portion of the micro light emitting device, wherein the second electrode overlaps only a portion of the second type semiconductor layer in a plan view.

18. The method of claim 17, wherein the display apparatus includes a plurality of pixels, each of the plurality of pixels includes a blue sub pixel configured to display blue color, a green sub pixel configured to display green color, and a red sub pixel configured to display red color, and wherein each of the plurality of sub light emitting devices is configured to emit blue light, a green color conversion layer is provided on an upper portion of a sub light emitting device in the green sub pixel, and a red color conversion layer is provided on an upper portion of a sub light emitting device in the red sub pixel.

19. The method of claim 17, wherein the separator is configured to electrically and optically separate the plurality of sub light emitting devices.

20. The method of claim 17, wherein the separator includes an insulator having a light absorption or reflection characteristic.

* * * * *